(12) United States Patent
Takano et al.

(10) Patent No.: US 11,506,733 B2
(45) Date of Patent: Nov. 22, 2022

(54) MAGNETIC SENSOR, AND A CURRENT SENSOR AND POSITION DETECTION DEVICE USING A MAGNETIC SENSOR

(71) Applicant: TDK Corporation, Tokyo (JP)

(72) Inventors: Kenichi Takano, Tokyo (JP); Tsuyoshi Umehara, Tokyo (JP); Yuta Saito, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/350,558

(22) Filed: Jun. 17, 2021

(65) Prior Publication Data

US 2022/0065956 A1  Mar. 3, 2022

(30) Foreign Application Priority Data

Aug. 27, 2020 (JP) .............................. JP2020-143495

(51) Int. Cl.
  *G01R 33/09* (2006.01)
  *G01R 33/00* (2006.01)

(52) U.S. Cl.
  CPC ....... *G01R 33/098* (2013.01); *G01R 33/0017* (2013.01); *G01R 33/091* (2013.01); *G01R 33/093* (2013.01)

(58) Field of Classification Search
  CPC . G01R 33/098; G01R 33/0017; G01R 33/091
  See application file for complete search history.

(56) References Cited

U.S. PATENT DOCUMENTS

| | | | |
|---|---|---|---|
| 2017/0154487 A1* | 6/2017 | Asano | G01R 33/09 |
| 2018/0088188 A1* | 3/2018 | Koyama | G01R 33/04 |
| 2018/0306843 A1* | 10/2018 | Bussing | G01R 15/207 |
| 2019/0079148 A1* | 3/2019 | Ohta | G01R 33/0005 |
| 2019/0148626 A1* | 5/2019 | Honma | G01R 33/098 |
| | | | 257/421 |
| 2019/0195966 A1 | 6/2019 | Watanabe | |
| 2019/0285435 A1* | 9/2019 | Ohta | G01R 33/0094 |
| 2020/0132786 A1 | 4/2020 | Takano et al. | |

FOREIGN PATENT DOCUMENTS

| | | |
|---|---|---|
| JP | 2005-257605 A | 9/2005 |
| JP | 5210983 B2 | 3/2013 |
| JP | 2019-117087 A | 7/2019 |
| JP | 6610746 B1 | 11/2019 |
| WO | 2009/084435 A1 | 7/2009 |

* cited by examiner

*Primary Examiner* — Alvaro E Fortich
(74) *Attorney, Agent, or Firm* — Posz Law Group, PLC

(57) ABSTRACT

A magnetic sensor comprises a magnetoresistive effect element including a first side surface and a second side surface facing in opposite directions along a first axis and a first end surface and a second end surface facing in opposite directions along a second axis substantially orthogonal to the first axis. The sensor has a sensitivity axis extending in a direction of the first axis, a first yoke unit provided adjacent to the first side surface of the magnetoresistive effect element, and a first bias magnetic field generation unit provided adjacent to the first end surface of the magnetoresistive effect element. The first bias magnetic field generation unit is provided to be capable of applying a bias magnetic field on the magnetoresistive effect element and the first yoke unit.

20 Claims, 19 Drawing Sheets

MAGNETIC SENSOR, AND A CURRENT SENSOR AND POSITION DETECTION DEVICE USING A MAGNETIC SENSOR

CROSS REFERENCE TO RELATED APPLICATION

This application is based on and claims priority to Japanese Patent Application No. 2020-143495 filed on Aug. 27, 2020, the disclosure of which is incorporated herein by reference.

BACKGROUND

The present invention relates to a magnetic sensor and a current sensor and a position detection device using this magnetic sensor.

In recent years, a physical quantity detection device (a position detection device) has been used for detecting physical quantities (for example, the position and movement amount (change amount) caused by the rotational movement or linear movement of a moving body, or the like) in a variety of applications. As this physical quantity detection device, one equipped with a magnetic sensor capable of detecting change in an external magnetic field has been known, and a sensor signal corresponding to change in the external magnetic field is output from the magnetic sensor. In addition, a current sensor or the like has been known that has been used in control or the like of the input/output current of a battery in a hybrid electric vehicle (HEV) or electric vehicle (EV) or the like, for example, and that measures the input/output current flowing in a conductor such as a bus bar or the like connected to the battery. As this current sensor, one has been known that is provided with a magnetic sensor capable of detecting a magnetic field generated by current flowing in a conductor such as a bus bar or the like.

The magnetic sensor has a magnetic sensor element that detects the magnetic field to be detected, and as the magnetic sensor element, a magnetoresistive effect element (an AMR element, GMR element, TMR element or the like), the resistance of which changes in accordance with change in the external magnetic field or the like is known. AMR elements have a ferromagnetic layer exhibiting an anisotropic magnetoresistive effect, and the resistance value of the AMR element changes due to the magnetization direction of the ferromagnetic layer changing by applying an external magnetic field. GMR elements and TMR elements are composed with a layered structure having at least a free layer, the magnetization direction of which is caused to change in accordance with the external magnetic field, a magnetization fixed layer, the magnetization direction of which is fixed, and a nonmagnetic layer interposed between the free layer and the magnetization fixed layer. In GMR elements and TMR elements, the resistance value of the GMR element and TMR element is determined by the angle formed by the magnetization direction of the free layer and the magnetization direction of the magnetization fixed layer. Furthermore, the resistance value of a GMR element and a TMR element changes as the angle formed by the magnetization direction of the free layer and the magnetization fixed layer changes due to changes in the magnetization direction of the free layer in accordance with the external magnetic field. In magnetic sensors containing AMR elements, GMR elements or TMR elements, a sensor signal is output in accordance with changes in the external magnetic field due to changes in the above-described resistance value.

In a magnetic sensor having the above-described magnetoresistive effect element, stabilization of the magnetization of the above-described ferromagnetic layer and free layer is important for a highly accurate sensor signal to be stably output. To increase stability of the magnetization of the ferromagnetic layer in AMR elements or the free layer in GMR elements or TMR elements, a magnetic sensor has been known that contains a magnet to apply a bias magnetic field on the ferromagnetic layer or the free layer.

PATENT LITERATURE

Patent Literature 1 U.S. Pat. No. 6,610,746

By having a magnet that applies the above-described bias magnetic field, and by applying the bias magnetic field on the ferromagnetic layer of the AMR element or the free layer of the GMR element or TMR element, the accuracy of the sensor signal output from the magnetic sensor is improved. On the other hand, accompanying progress in increasing the performance of applications that use magnetic sensors, proposals for magnetic sensors capable of outputting more accurate and more stable sensor signals are currently desired.

In consideration of the foregoing, it is an object of the present invention to provide a magnetic sensor capable of outputting highly accurate and stable sensor signals and to provide a current sensor and position detection device that use such a magnetic sensor.

SUMMARY

In order to resolve the above-described problem, the present invention provides a magnetic sensor that includes a magnetoresistive effect element including a first side surface and a second side surface facing in opposite directions along a first axis, and a first end surface and a second end surface facing in opposite directions along a second axis substantially orthogonal to the first axis, and having a sensitivity axis extending in a direction of the first axis, a first yoke unit provided adjacent to the first side surface of the magnetoresistive effect element, and a first bias magnetic field generation unit provided adjacent to the first end surface of the magnetoresistive effect element, wherein the first bias magnetic field generation unit is provided so as to be capable of applying a bias magnetic field on the magnetoresistive effect element and the first yoke unit.

The length of the first bias magnetic field generation unit in the first direction may be longer than the sum of the lengths of the magnetoresistive effect element and the first yoke unit in the first direction, and the magnetoresistive effect element and the first yoke unit may be provided to fit in the range of the length of the first bias magnetic field generation unit in the first direction.

The magnetic sensor may further comprise a second yoke unit provided adjacent to the second side surface of the magnetoresistive effect element, the length of the first bias magnetic field generation unit in the first direction may be longer than the sum of the lengths of the magnetoresistive effect element, the first yoke unit and the second yoke unit in the first direction, and the magnetoresistive effect element, the first yoke unit and the second yoke unit may be provided so as to fit in the range of the length of the first bias magnetic field generation unit in the first direction.

The magnetic sensor may further comprise a plurality of the magnetoresistive effect elements, wherein the magnetoresistive effect elements and either one of the first yoke unit or the second yoke unit are arranged alternatingly along the first direction. The magnetic sensor may further comprise a second bias magnetic field generation unit provided adjacent to the second end surface of the magnetoresistive effect element, the second bias magnetic field generation unit may touch the second end surface of the magnetoresistive effect element, and the second bias magnetic field generation unit may face the second end surface of the magnetoresistive effect element with a prescribed gap in between.

The first bias magnetic field generation unit may touch the first end surface of the magnetoresistive effect element, and the first bias magnetic field generation unit may face the first end surface of the magnetoresistive effect element with a prescribed gap in between. The first bias magnetic field generation unit may have a first facing surface facing the first end surface of the magnetoresistive effect element, the first facing surface may be inclined at a prescribed angle with respect to a third direction orthogonal to the first direction and the second direction, and the edge of the first end surface side of the magnetoresistive effect element may overlap the edge of the first facing surface side of the first bias magnetic field generation unit when viewed along the third direction.

The magnetic sensor may further comprise a second bias magnetic field generation unit provided adjacent to the second end surface of the magnetoresistive effect element, the second bias magnetic field generation unit may have a second facing surface facing the second end surface of the magnetoresistive effect element, the second end surface may be inclined at a prescribed angle with respect to the third direction orthogonal to the first direction and the second direction, and the edge of the second end surface side of the magnetoresistive effect element may overlap the edge of the second facing surface side when viewed along the third direction.

The first bias magnetic field generation unit may have a facing surface that faces the first end surface of the magnetoresistive effect element and a protruding part that protrudes toward the first end surface of the magnetoresistive effect element from the facing surface. The magnetic sensor may further comprise a second bias magnetic field generation unit provided adjacent to the second end surface of the magnetoresistive effect element, and the second bias magnetic field generation unit may have a facing surface that faces the second end surface of the magnetoresistive effect element and a protruding part that protrudes toward the second end surface of the magnetoresistive effect element from the facing surface.

The magnetoresistive effect element may include a laminated body in which at least a magnetization fixed layer the magnetization of which is fixed, and a magnetization free layer the magnetization direction of which changes in accordance with an external magnetic field, are layered, and may be an AMR element, a GMR element or a TMR element.

The present invention provides a position detection device comprising a magnetic detection unit that outputs a detection signal based on change in an external magnetic field accompanying movement of a moving body, and a position detection unit that detects the position of the moving body based on the detection signal output from the magnetic detection unit, wherein the magnetic detection unit includes the above-described magnetic sensor.

The present invention provides a current sensor comprising a magnetic detection unit that detects magnetism generated from a conductor in which a current to be measured flows, wherein the magnetic detection unit includes the above-described magnetic sensor.

With the present invention, it is possible to provide a magnetic sensor capable of outputting more accurate and more stable sensor signals, and a current sensor and position detection device that use such a magnetic sensor.

DETAILED DESCRIPTION

Figure 1:
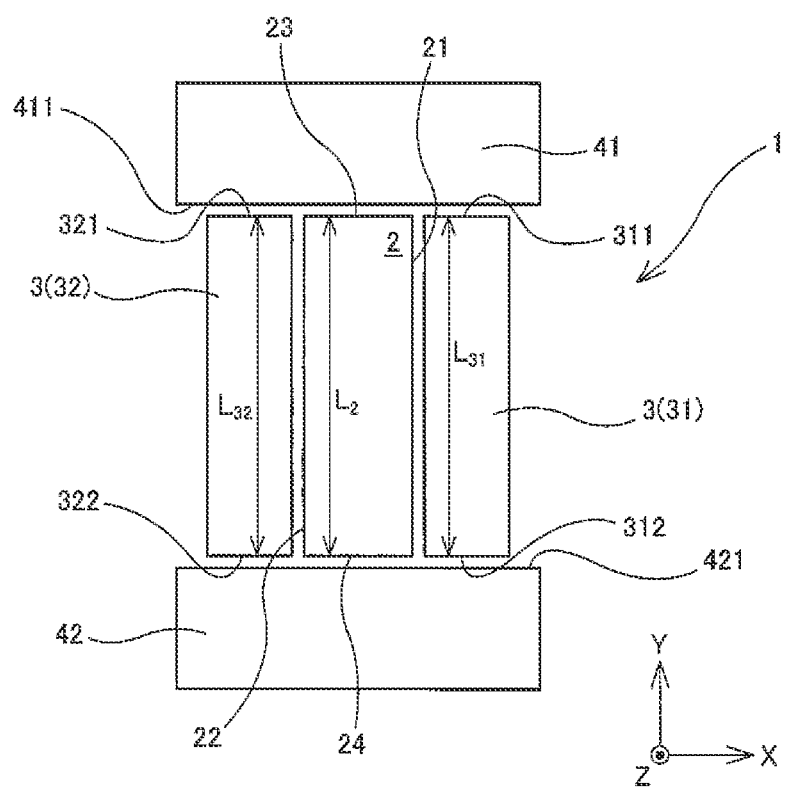
FIG. 1 is a plan view showing the schematic configuration of a first aspect of a magnetic sensor according to an embodiment of the present invention.
Figure 2A:
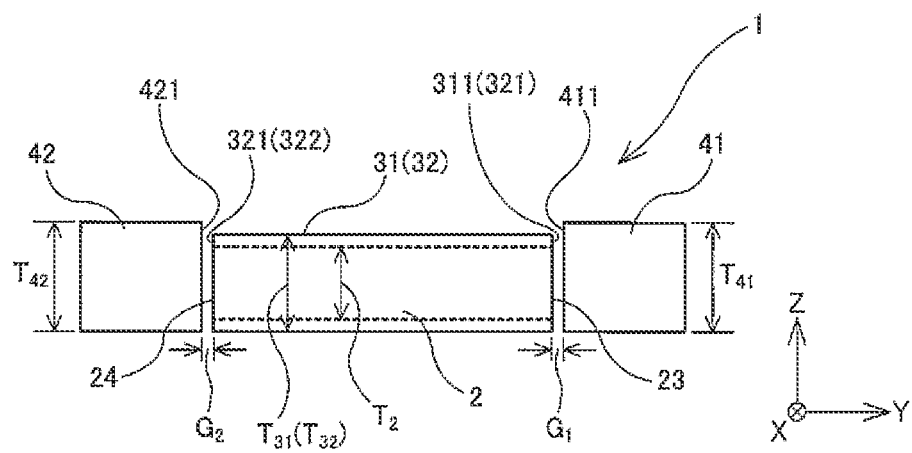
FIG. 2A is a cross-sectional view showing the schematic configuration of the first aspect of the magnetic sensor according to the embodiment of the present invention.
Figure 2B:
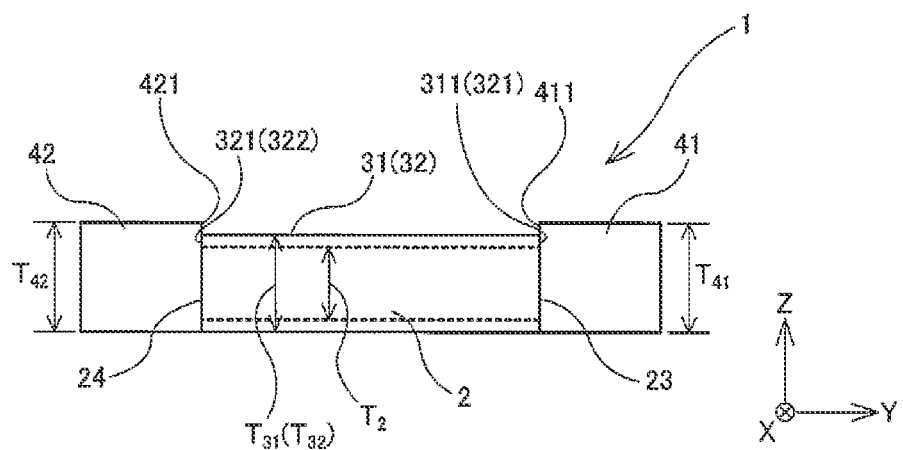
FIG. 2B is a cross-sectional view showing the schematic configuration of a variation of the first aspect of the magnetic sensor according to the embodiment of the present invention.
Figure 3A:
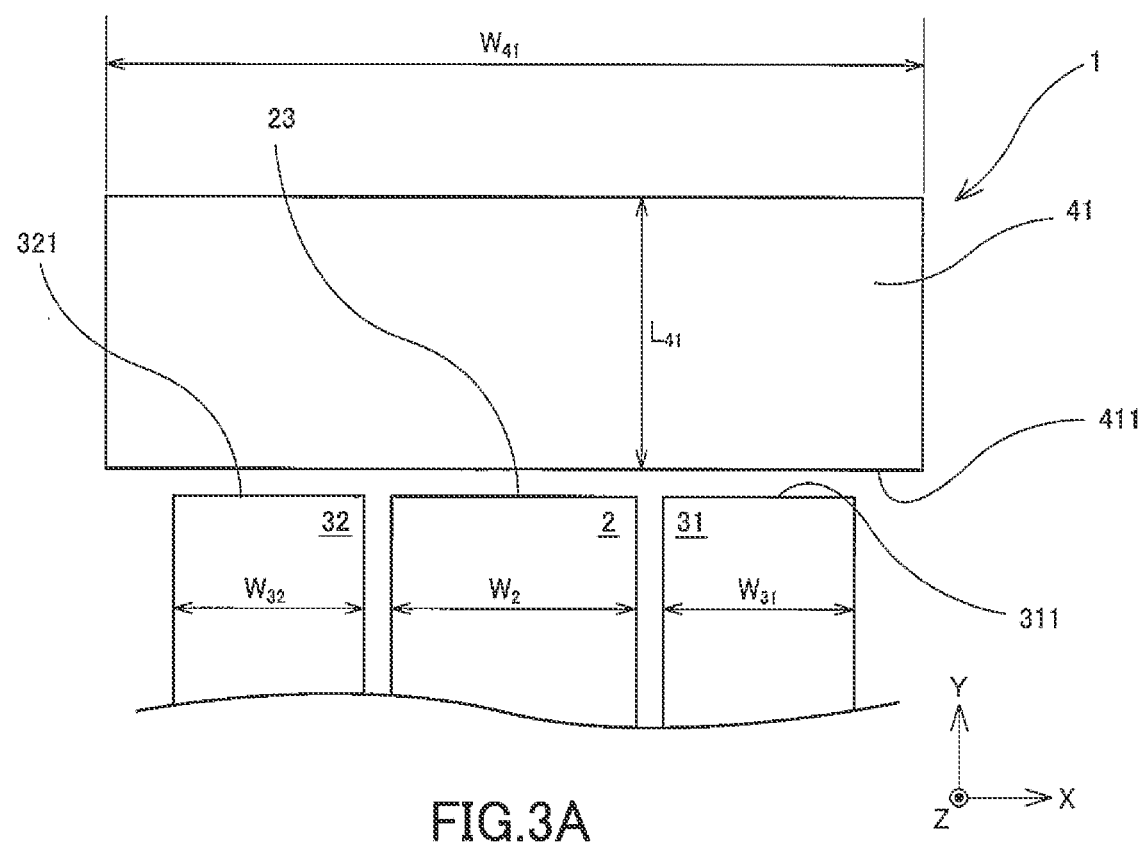
FIG. 3A is a partial enlarged plan view showing the schematic configuration of the first aspect of the magnetic sensor according to the embodiment of the present invention.
Figure 3B:
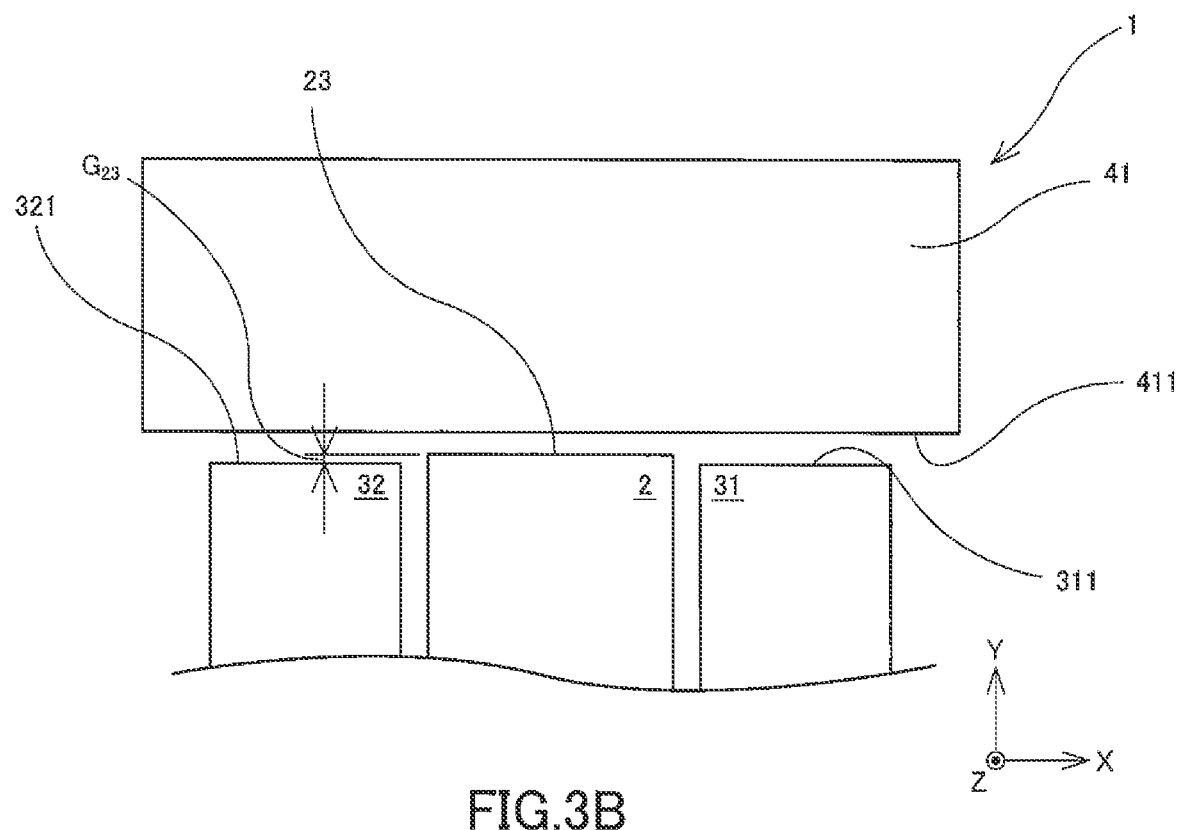
FIG. 3B is a partial enlarged plan view showing the schematic configuration of a variation of the first aspect of the magnetic sensor according to the embodiment of the present invention.
Figure 3C:
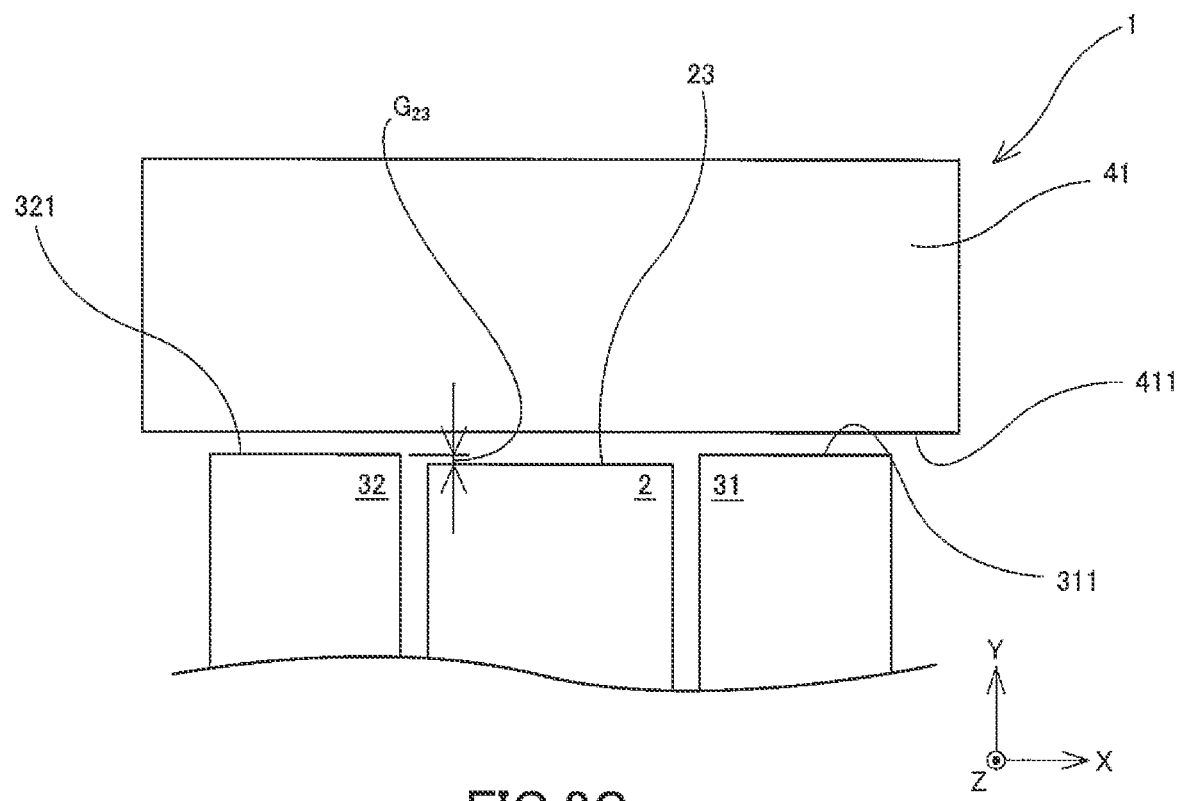
FIG. 3C is a partial enlarged plan view showing the schematic configuration of a variation of the first aspect of the magnetic sensor according to the embodiment of the present invention.
Figure 4:
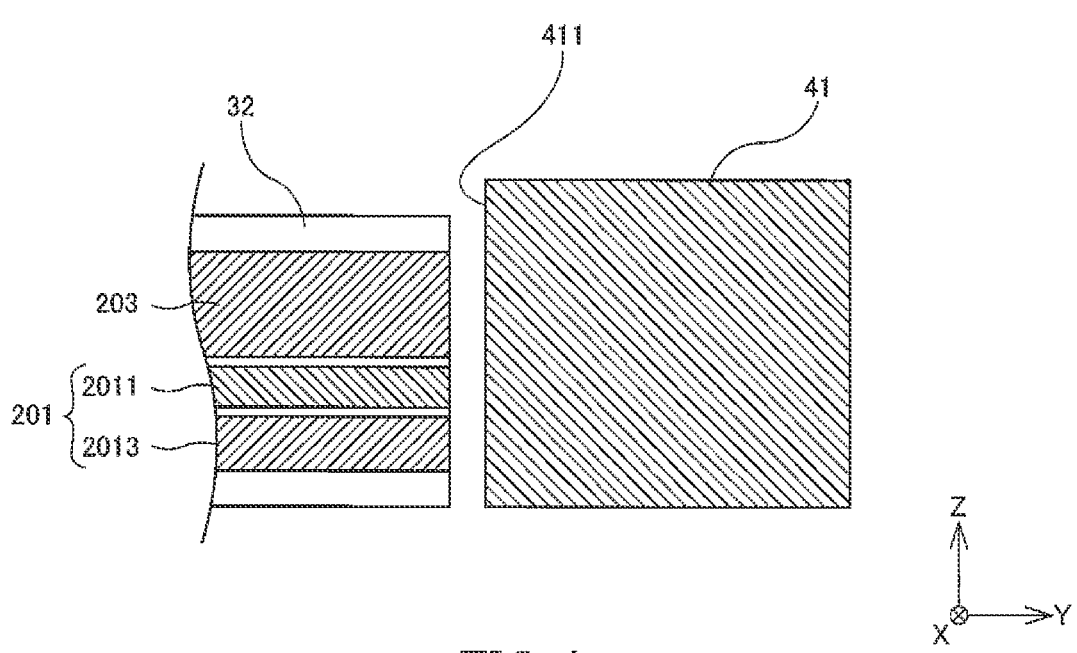
FIG. 4 is a partial enlarged cross-sectional view showing the schematic configuration of the first aspect of the magnetic sensor according to the embodiment of the present invention.

Below, the best mode for implementing the magnetic sensor of the present invention is described with reference to the drawings. FIG. 1 is a plan view showing the schematic configuration of the first aspect of a magnetic sensor according to this embodiment, FIG. 2A is a cross-sectional view showing the schematic configuration of the first aspect of the magnetic sensor according to this embodiment, FIG. 2B is a cross-sectional view showing the schematic configuration of a variation of the first aspect of the magnetic sensor according to this embodiment, FIG. 3A is a partial enlarged plan view showing the schematic configuration of the first aspect of the magnetic sensor according to this embodiment, FIG. 3B and FIG. 3C are partial enlarged plan views showing the schematic configuration of variations of the first aspect of the magnetic sensor according to this embodiment, and FIG. 4 is a partial enlarged cross-sectional view showing the schematic configuration of the first aspect of the magnetic sensor according to this embodiment.

In describing this embodiment, the "X direction, Y direction and Z direction" are stipulated when necessary in some of the drawings. Here, the X direction and the Y direction in this embodiment are substantially orthogonal to each other (the angle of intersection of the X direction and the Y direction is within the range of 85~95°) within the plane of the substrate (within a plane substantially parallel to the first surface and the second surface of the substrate), and the Z direction is the direction of thickness of the substrate (a direction orthogonal to the first surface and the second surface of the substrate).

The magnetic sensor 1 according to this embodiment includes a magnetoresistive effect element 2 that includes a first side surface 21 and a second side surface 22, which face each other in the X direction as a first direction, and a first end surface 23 and a second end surface 24, which face each other in the Y direction, and having an axis of sensitivity in the X direction; a first yoke unit 31 (yoke unit 3) provided adjacent to the first side surface 21 of the magnetoresistive effect element 2; a second yoke unit 32 (yoke unit 3) provided adjacent to the second side surface 22 of the magnetoresistive effect element 2; a first bias magnetic field generation unit 41 provided adjacent to the first end surface 23 of the magnetoresistive effect element 2; and a second bias magnetic field generation unit 42 provided adjacent to the second end surface 24 of the magnetoresistive effect element 2.

In this embodiment, the magnetoresistive effect element 2, the first yoke unit 31, the second yoke unit 32, the first bias magnetic field generation unit 41 and the second bias magnetic field generation unit 42 may be provided on a first surface of a substrate (for example, a semiconductor substrate such as a silicon wafer; a ceramic substrate such as an AlTiC substrate, an alumina substrate or the like; a resin substrate; a glass substrate or the like; omitted from the drawings) having a first surface and a second surface opposite thereto, via an insulating sublayer or the like made of Al$_2$O$_3$ or the like. The first surface of the substrate is a surface parallel to the XY plane that includes the X direction and the Y direction, and the Z direction is a direction orthogonal to the first surface of the substrate.

Figure 13A:
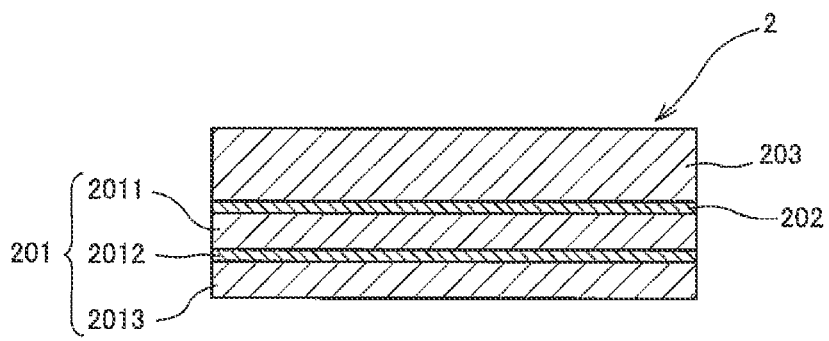
FIG. 13A is a cross-sectional end view showing the schematic configuration of one aspect of a magnetoresistive effect element in the embodiment of the present invention.
Figure 13B:
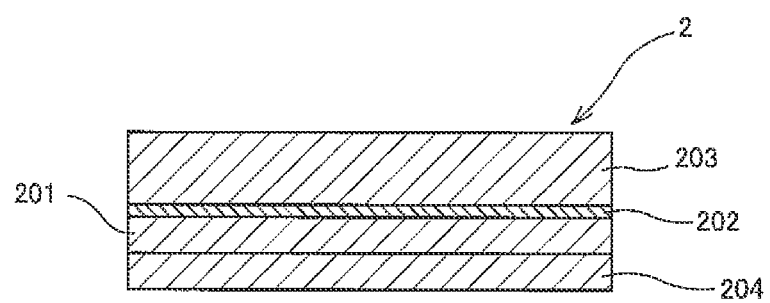
FIG. 13B is a cross-sectional end view showing the schematic configuration of another aspect of a magnetoresistive effect element in the embodiment of the present invention.

As the magnetoresistive effect element 2 in this embodiment, an MR element such as an AMR element (anisotropic magnetoresistive effect element) having a ferromagnetic layer that exhibits an anisotropic magnetoresistive effect, a GMR element (giant magnetoresistive effect element), TMR element (tunnel magnetoresistive effect element) or the like can be used. The GMR element or TMR element as the magnetoresistive effect element 2 is, for example, a laminated body that has a spin-value-type film structure and includes a magnetization fixed layer 201, a nonmagnetic layer 202 and a free layer 203, layered in that order from the substrate side (see FIG. 13A). The magnetization fixed layer 201 is a laminated ferri structure including a first ferromagnetic layer 2011, a nonmagnetic intermediate layer 2012 and a second ferromagnetic layer 2013 and is a so-called self-pinned fixed layer (synthetic ferri pinned layer, or SFP layer) in which the first ferromagnetic layer 2011 and the second ferromagnetic layer 2013 are antiferromagnetically coupled. In the magnetization fixed layer 201 (SFP layer), the first ferromagnetic layer 2011 near the nonmagnetic layer 202 can be referred to as a reference layer because this layer becomes a reference for the angle of rotation of the magnetization direction of the free layer 203. The magnetoresistive effect element 2 may be a laminated body that includes the free layer 203, the nonmagnetic layer 202 and the magnetization fixed layer 201, layered in that order from the substrate side. In addition, the magnetoresistive effect element 2 may be a laminated body in which an antiferromagnetic layer 204, the magnetization fixed layer 201 comprising one layer of the ferromagnetic layer, the nonmagnetic layer 202 and the free layer 203 are layered in that order (see FIG. 13B). The antiferromagnetic layer 204 is made of an antiferromagnetic material and serves the role of fixing the direction of magnetization of the magnetization fixed layer 201 by being exchange coupled with the magnetization fixed layer 201.

When the magnetoresistive effect element 2 is a TMR element, the nonmagnetic layer 202 is a tunnel barrier layer. When the magnetoresistive effect element 2 is a GMR element, the nonmagnetic layer 202 is a nonmagnetic conductive layer. In the TMR element and GMR element, the resistance value changes in accordance with the angle formed by the magnetization direction of the free layer 203 with respect to the magnetization direction of the magnetization fixed layer 201. The resistance value is a minimum when this angle is 0° (the magnetization directions are parallel to each other), and the resistance value is a maximum when this angle is 180° (the magnetization directions are antiparallel to each other).

In the magnetoresistive effect element 2 that is a GMR element or a TMR element, the magnetization direction of the free layer 203 is substantially parallel to the Y direction, and the angle of the magnetization direction of the free layer 203 with respect to the Y direction may be 5° or less. In addition, the magnetization direction of the magnetization fixed layer 201 is substantially parallel to the X direction, and the angle of the magnetization direction of the magnetization fixed layer 201 with respect to the X direction may be 5° or less. That is to say, the magnetization direction of the free layer 203 and the magnetization layer of the magnetization fixed layer 201 are substantially orthogonal to each other. By having the magnetization direction of the free layer 203 be substantially parallel to the Y direction and the magnetization direction of the magnetization fixed layer 201 be substantially parallel to the X direction, the magnetization of the free layer 203 rotates when an external magnetic field in the X direction is applied on the free layer 203. Accordingly, the resistance value of the magnetoresistive effect element 2 changes.

In the plan view of the magnetic sensor 1 the magnetoresistive effect element 2 has a roughly rectangular shape with the length W2 in the X direction being shorter than the length L2 in the Y direction. The length W2 of the magnetoresistive effect element 2 in the X direction is not particularly limited, but for example may be on the order of 0.3~1.5 μm. The length L2 of the magnetoresistive effect element 2 in the Y direction is not particularly limited, but for example may be on the order of 0.6~3.0 μm. The length T2 of the magnetoresistive effect element 2 in the Z direction is not particularly limited, but for example may be on the order of 0.02~0.08 μm.

The first yoke unit 31 and the second yoke unit 32 may be made of a soft magnetic material such as NiFe, CoFe, CoFeSiB, CoZrNb or the like, for example. The first yoke unit 31 is provided adjacent to the first side surface 21 of the magnetoresistive effect element 2, and the second yoke unit 32 is provided adjacent to the second side surface 22 of the magnetoresistive effect element 2. That is, in the X direction, the magnetoresistive effect element 2 is interposed in between the first yoke unit 31 and the second yoke unit 32. Because the first yoke unit 31 and the second yoke unit 32, which are provided on both sides of the magnetoresistive effect element 2 in the X direction, focus the external magnetic field along the X direction, it is possible to improve the sensitivity of the magnetic sensor 1.

The first yoke unit 31 and the second yoke unit 32 respectively have first end surfaces 311 and 321, which face the first bias magnetic field generation unit 41 and second end surfaces 312 and 322, which face the second bias magnetic field generation unit 42. In the first aspect of the magnetic sensor 1 according to this embodiment, the first end surfaces 311 and 321 of the first yoke unit 31 and the second yoke unit 32 may be positioned on substantially the same XZ plane as the first end surface 23 of the magnetoresistive effect element 2, and the second end surfaces 312 and 322 of the first yoke unit 31 and the second yoke unit 32 may be positioned on substantially the same XZ plane as the second end surface 24 of the magnetoresistive effect element 2. By having this kind of configuration, it is possible to improve the sensitivity of the magnetic sensor 1. "The first end surface 23 of the magnetoresistive effect element 2 and the first end surfaces 311 and 321 of the first yoke unit 31 and the second yoke unit 32 being positioned on substantially the same XZ plane" means that in the side view along the X direction, the first end surface 23 of the magnetoresistive effect element 2 being positioned closer to the first bias magnetic field generation unit 41 than the first end surfaces 311 and 321 of the first yoke unit 31 and the second yoke unit 32 (see FIG. 3B) is tolerated. Also, the first end surfaces 311 and 321 of the first yoke unit 31 and the second yoke unit 32 being positioned closer to the first bias magnetic field generation unit 41 than the first end surface 23 of the magnetoresistive effect element 2 (see FIG. 3C) is tolerated. Similarly, "the second end surface 24 of the magnetoresistive effect element 2 and the second end surfaces 312 and 322 of the first yoke unit 31 and the second yoke unit 32 being positioned on substantially the same XZ plane" means that in the side view along the X direction, the second end surface 24 of the magnetoresistive effect element 2 being positioned closer to the second bias magnetic field generation unit 42 than the second end surfaces 312 and 322 of the first yoke unit 31 and the second yoke unit 32 is tolerated. Also, the second end surfaces 312 and 322 of the first yoke unit 31 and the second yoke unit 32 being positioned closer to the second bias magnetic field generation unit 42 than the second end surface 24 of the magnetoresistive effect element 2 is tolerated. In such a case, the distance G23 between the first end surface 23 and the first end surfaces 311 and 321 in the Y direction and the distance between the second end surface 24 and the second end surfaces 312 and 322 in the Y direction may be on the order of 50 nm or less.

When viewed from the side surface of the magnetic sensor 1 along the X direction, the position of the first end surfaces 311 and 321 of the first yoke unit 31 and the second yoke unit 32 in the Y direction may be substantially the same as the position of the first end surface 23 of the magnetoresistive effect element 2 (free layer 203) in the Y direction, and the first facing surface 411 of the first bias magnetic field generation unit 41 may be positioned further in the +Y direction than the first end surface 23 of the magnetoresistive effect element 2 and the first end surfaces 311 and 321 of the first yoke unit 31 and the second yoke unit 32. In addition, the position of the second end surfaces 312 and 322 of the first yoke unit 31 and the second yoke unit 32 in the Y direction may be substantially the same as the position of the second end surface 24 of the magnetoresistive effect element 2 (free layer 203) in the Y direction, and the second facing surface 421 of the second bias magnetic field generation unit 42 may be positioned further in the −Y direction than the second end surface 24 of the magnetoresistive effect element 2 and the second facing surfaces 312 and 322 of the first yoke unit 31 and the second yoke unit 32.

In the plan view of the magnetic sensor 1, the first yoke unit 31 and the second yoke unit 32 each have a roughly rectangular shape in which the length W31 or W32 in the X direction is shorter than the length L31 or L32 in the Y direction. The lengths W31 and W32 of the first yoke unit 31 and the second yoke unit 32 in the X direction are not particularly limited but may be on the order of 0.3~0.15 µm, for example. The lengths L31 and L32 of the first yoke unit 31 and the second yoke unit 32 in the Y direction may be substantially the same as the length L2 of the magnetoresistive effect element 2 in the Y direction and may be on the order of 0.6~3.0 µm, for example. The lengths T31 and T32 of the first yoke unit 31 and the second yoke unit 32 in the Z direction may be longer than the length T2 of the magnetoresistive effect element 2 in the Z direction and may be on the order of 0.01~0.06 µm, for example. When the lengths T31 and T32 of the first yoke unit 31 and the second yoke unit 32 in the Z direction are less than 0.01 µm, there is a concern that effectively focusing the external magnetic field along the X direction could become difficult, causing the sensitivity of the magnetic sensor 1 to decrease. On the other hand, when the lengths T31 and T32 in the Z direction exceed 0.06 µm, the sensitivity of the magnetic sensor 1 improves but there is a concern that hysteresis of the output signal from the magnetic sensor 1 could become large.

The first bias magnetic field generation unit 41 is provided adjacent to the first end surface 23 of the magnetoresistive effect element 2, and the second bias magnetic field generation unit 42 is provided adjacent to the second end surface 24 of the magnetoresistive effect element 2. By having the first bias magnetic field generation unit 41 and the second bias magnetic field generation unit 42 provided adjacent to the first end surface 23 and the second end surface 24, respectively, a bias magnetic field is applied on the free layer 203 when the magnetoresistive effect element 2 is a GMR element or TMR element and on the ferromagnetic layer in the case of an AMR element, so in a zero magnetic field state (the initial state in which no external magnetic field is applied on the free layer 203 or the ferromagnetic layer), it is possible to cause the magnetization direction of the free layer 203 or the ferromagnetic layer to be stabilized in the Y direction.

The first bias magnetic field generation unit 41 has the first facing surface 411 facing the first end surface 23 of the magnetoresistive effect element 2, and the second bias magnetic field generation unit 42 has the second facing surface 412 facing the second end surface 24 of the magnetoresistive effect element 2. The first facing surface 411 of the first bias magnetic field generation unit 41 and the first end surface 23 of the magnetoresistive effect element 2 (the free layer 203 or ferromagnetic layer) may be touching or may be separated by a prescribed gap G1. The second facing surface 412 of the second bias magnetic field generation unit 22 and the second end surface 24 of the magnetoresistive effect element 2 may be touching or may be separated by a prescribed gap G2. When the first facing surface 411 and the first end surface 23 are separated, the respective gaps G1 and G2 between them may be on the order of 100 nm or less, for example, and may be on the order of 5~100 nm, preferably on the order of 5~50 nm. When these gaps G1 and G2 exceed 100 nm, there is a concern that the bias magnetic field is not effectively applied the free layer 203 or the ferromagnetic layer, which could make it difficult to cause the magnetization direction of the free layer 203 or the ferromagnetic layer to be stabilized in the Y direction.

The lengths W41 and W42 of the first bias magnetic field generation unit 41 and the second bias magnetic field generation unit 42 in the X direction may be such that the magnetoresistive effect element 2, the first yoke unit 31 and the second yoke unit 32 fit within the region between the first bias magnetic field generation unit 41 and the second bias magnetic field generation unit 42 (the region within the range of these lengths W41 and W42). That is to say, the lengths W41 and W42 of the first bias magnetic field generation unit 41 and the second bias magnetic field generation unit 42 in the X direction may be at least as great as the sum of the lengths W2, W31 and W32 of the magnetoresistive effect element 2, the first yoke unit 31 and the second yoke unit 32 in the X direction and preferably longer than this sum. When the lengths W41 and W42 of the first bias magnetic field generation unit 41 and the second bias magnetic field generation unit 42 in the X direction are less than the aforementioned sum and a portion of the first yoke unit 31 and/or a portion of the second yoke unit 32 protrudes in the X direction from the above-described region, there is a concern that applying the bias magnetic field effectively on the first yoke unit 31 and/or the second yoke unit 32 will be difficult. The lengths W41 and W42 of the first bias magnetic field generation unit 41 and the second bias magnetic field generation unit 42 in the X direction may be on the order of 1~10 µm, for example.

The lengths L41 and L42 of the first bias magnetic field generation unit 41 and the second bias magnetic field generation unit 42 in the Y direction and the lengths T41 and T42 of the first bias magnetic field generation unit 41 and the second bias magnetic field generation unit 42 in the Z direction are not particularly limited as long as it is possible to apply the bias magnetic field effectively on the free layer 203 or ferromagnetic layer of the magnetoresistive effect element 2. For example, the lengths L41 and L42 in the Y direction may be on the order of 1~3 μm, and the lengths T41 and T42 in the Z direction may be on the order of 10~50 nm.

Next, a second aspect of the magnetic sensor 1 according to this embodiment will be described.

Figure 5:
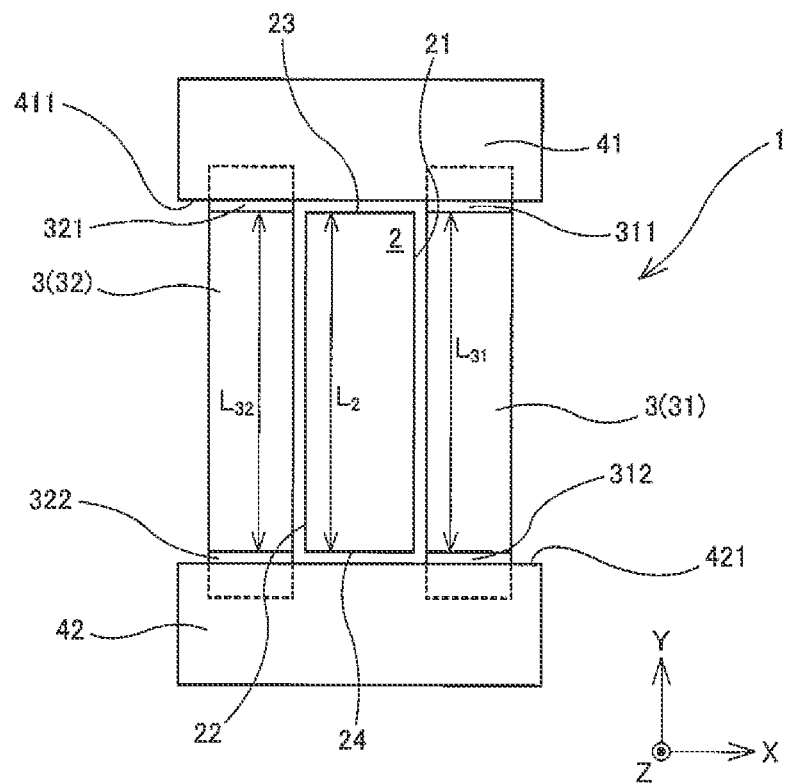
FIG. 5 is a plan view showing the schematic configuration of a second aspect of a magnetic sensor according to the embodiment of the present invention.
Figure 6:
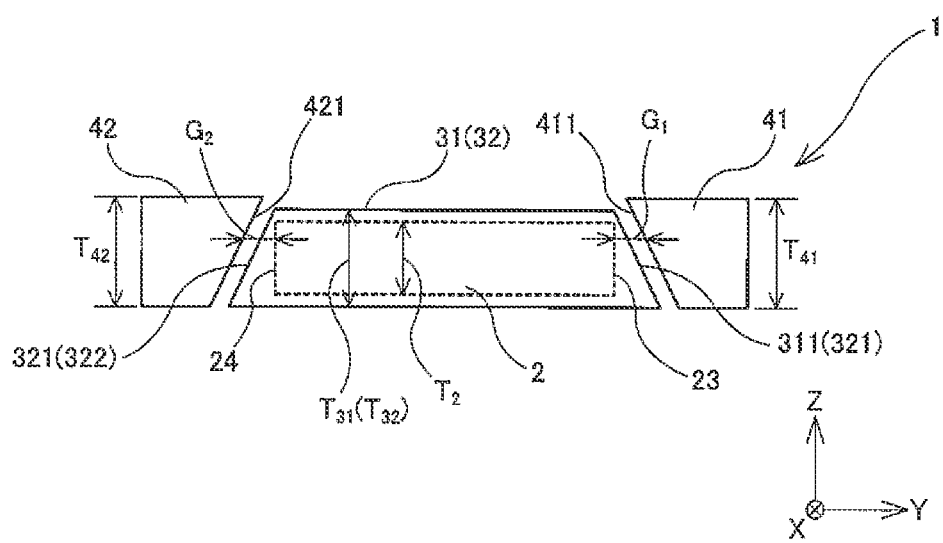
FIG. 6 is a cross-sectional view showing the schematic configuration of the second aspect of the magnetic sensor according to the embodiment of the present invention.
Figure 7A:
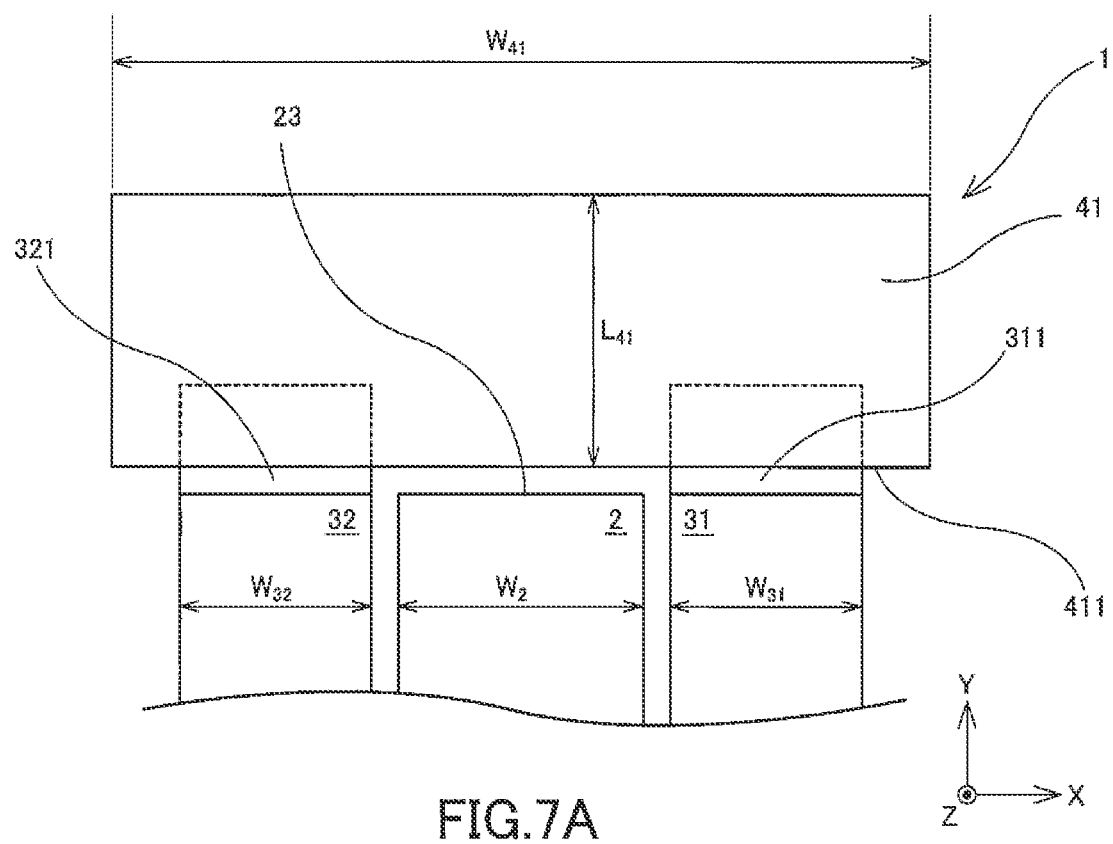
FIG. 7A is a partial enlarged plan view showing the schematic configuration of the second aspect of the magnetic sensor according to the embodiment of the present invention.
Figure 7B:
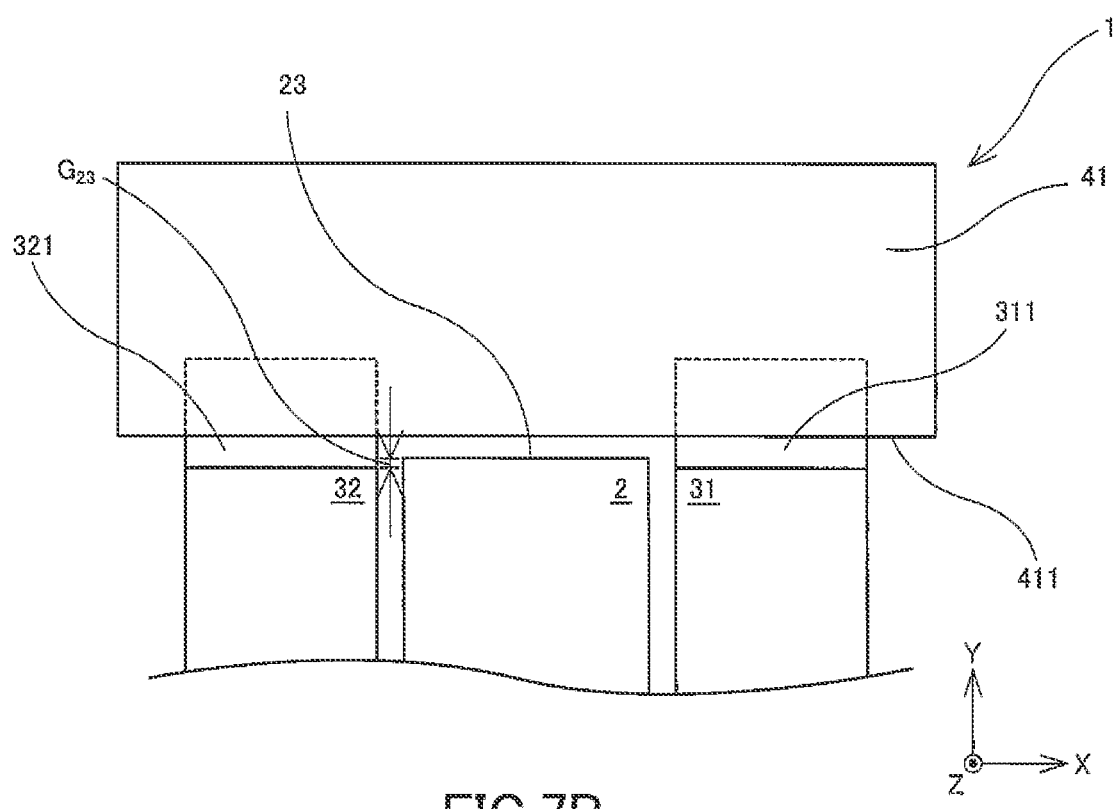
FIG. 7B is a partial enlarged plan view showing the schematic configuration of a variation of the second aspect of the magnetic sensor according to the embodiment of the present invention.
Figure 7C:
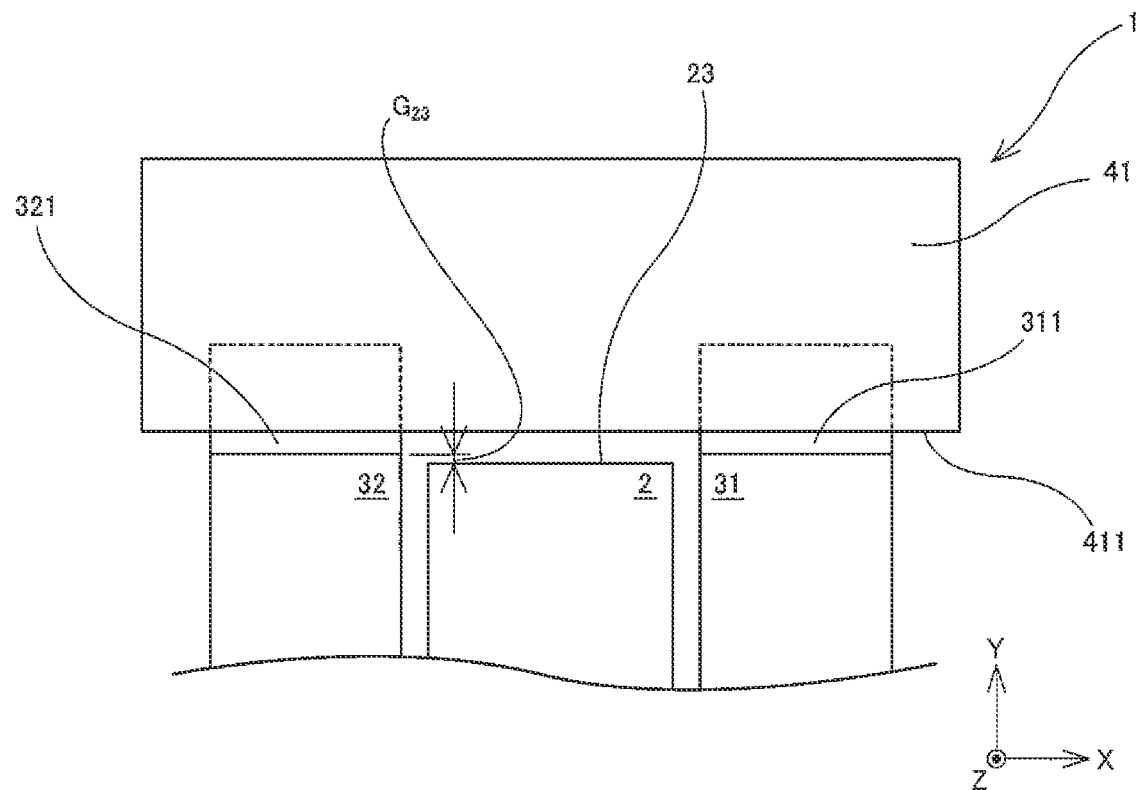
FIG. 7C is a partial enlarged plan view showing the schematic configuration of a variation of the second aspect of the magnetic sensor according to the embodiment of the present invention.
Figure 8A:
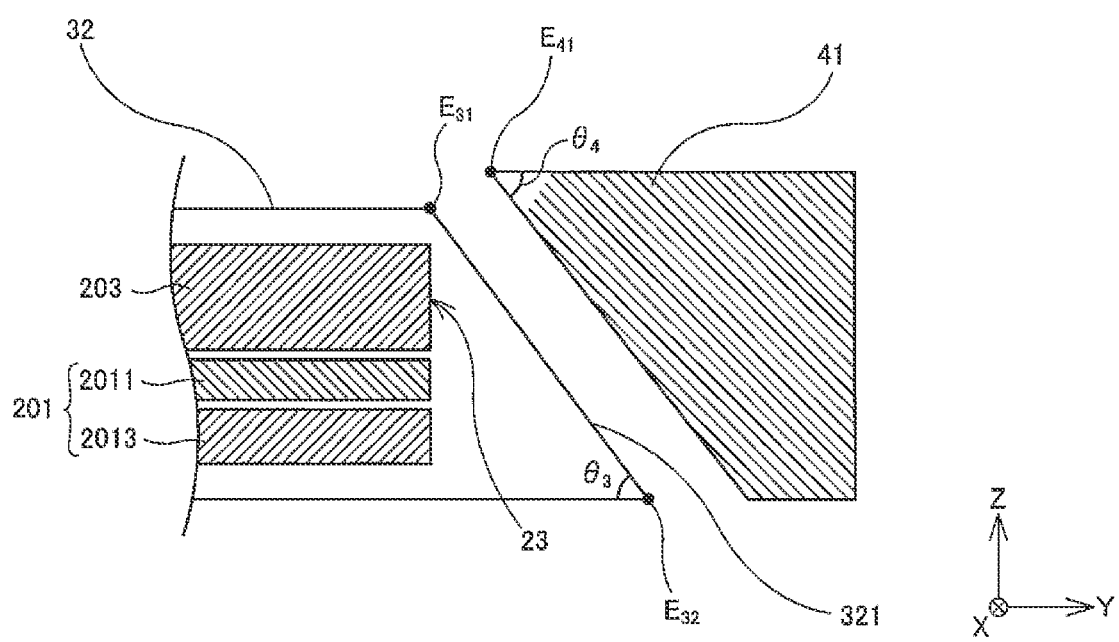
FIG. 8A is a partial enlarged cross-sectional view showing the schematic configuration of the second aspect of the magnetic sensor according to the embodiment of the present invention.
Figure 8B:
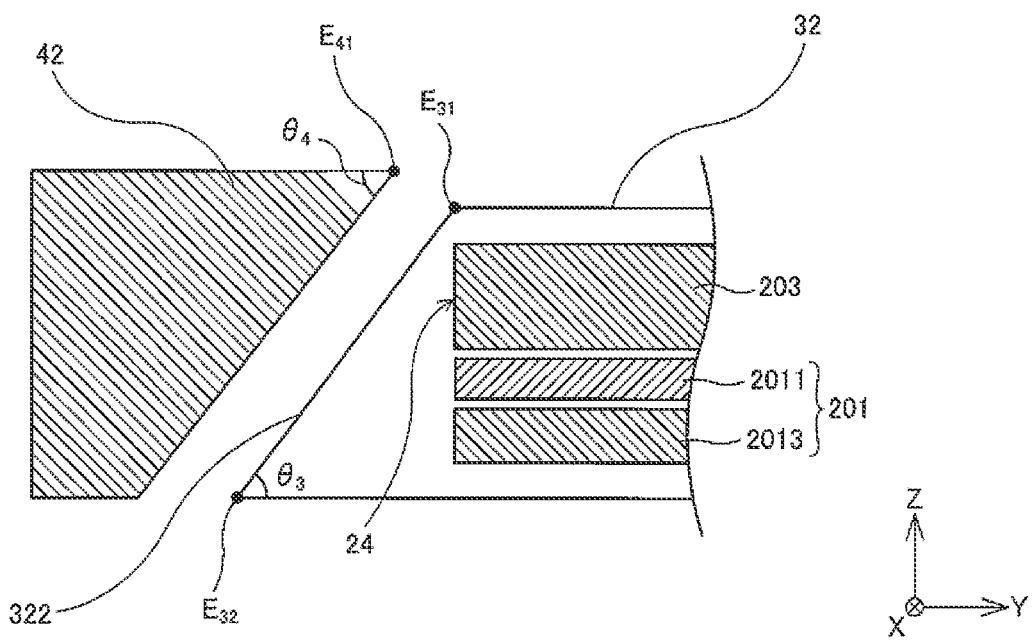
FIG. 8B is a partial enlarged cross-sectional view showing the schematic configuration of the second aspect of the magnetic sensor according to the embodiment of the present invention.

FIG. 5 is a plan view showing the schematic configuration of the second aspect of the magnetic sensor according to this embodiment, FIG. 6 is a cross-sectional view showing the schematic configuration of the second aspect of the magnetic sensor according to this embodiment, FIG. 7A is a partial enlarged plan view showing the schematic configuration of the second aspect of the magnetic sensor according to this embodiment, FIG. 7B and FIG. 7C are partial enlarged plan views showing the schematic configuration of a variation of the second aspect of the magnetic sensor according to this embodiment, and FIG. 8A and FIG. 8B are partial enlarged cross-sectional views showing the schematic configuration of the second aspect of the magnetic sensor according to this embodiment. Parts of the configuration that are like the first aspect of the magnetic sensor 1 shown in FIGS. 1~4 are labeled with the same symbols and detailed description of such is omitted here.

As shown in FIG. 5 through FIG. 8B, in the second aspect of the magnetic sensor 1 according to this embodiment, the first end surfaces 311 and 321 and the second end surfaces 312 and 322 of the first yoke unit 31 and the second yoke unit 32 are inclined at a prescribed angle with respect to the XV plane that includes the X direction and the Y direction. In addition, the first facing surface 411 of the first bias magnetic field generation unit 41 and the second facing surface 412 of the second bias magnetic field generation unit 42 are inclined at a prescribed angle with respect to the XY plane that includes the X direction and the Y direction.

The inclination angle $\theta_3$ of the first end surfaces 311 and 321 and the second end surfaces 312 and 322 of the first yoke unit 31 and the second yoke unit 32, and the inclination angle $\theta_4$ of the first facing surface 411 of the first bias magnetic field generation unit 41 and the second facing surface 412 of the second bias magnetic field generation unit 42 may be 20~80°, for example, and preferably 30~70°, and particularly preferably, 40~60°. By having the first yoke unit 31 and the second yoke unit 32 provided at the first side surface 21 and the second side surface 22, respectively, of the magnetoresistive effect element 2 it is possible to cause the first yoke unit 31 and the second yoke unit 32 to focus the external magnetic field along the X direction. As a result, the sensitivity of the magnetic sensor 1 is improved. The external magnetic field focusing effect by the first yoke unit 31 and the second yoke unit 32 is dependent on the lengths T31 and T32 (thicknesses) of the first yoke unit 31 and the second yoke unit 32 in the Z direction. That is to say, the greater the thicknesses of the first yoke unit 31 and the second yoke unit 32, the more efficiently the external magnetic field can be focused in the X direction, thereby making it easier to improve the sensitivity of the magnetic sensor 1. On the other hand, the greater the thicknesses of the first yoke unit 31 and the second yoke unit 32, the more it becomes difficult for the bias magnetic field from the first bias magnetic field generation unit 41 and the second bias magnetic field generation unit 42 to be effectively applied on the first yoke unit 31 and the second yoke unit 32, causing the concern that hysteresis of the output signal from the magnetic sensor 1 could become large. In the second aspect of the magnetic sensor 1 according to this embodiment, the first end surfaces 311 and 321 and the second end surfaces 312 and 322 of the first yoke unit 31 and the second yoke unit 32, and the first facing surface 411 of the first bias magnetic field generation unit 41 and the second facing surface 412 of the second bias magnetic field generation unit 42, are inclined at a prescribed angle, and through this, even if the lengths T31 and T32 of the first yoke unit 31 and the second yoke unit 32 in the Z direction are sufficient to cause the sensitivity of the magnetic sensor 1 to improve, it is possible to control the occurrence of hysteresis of the output signal from the magnetic sensor 1.

When viewed from the side surface of the magnetic sensor 1 along the X direction, the position in the Y direction of a first edge E31 of the first end surfaces 311 and 321 of the first yoke unit 31 and the second yoke unit 32 may be substantially the same as the position of the first end surface 23 of the magnetoresistive effect element 2 (the free layer 203 or the ferromagnetic layer) in the Y direction, and the position in the Y direction of a second edge E32 of the first end surfaces 311 and 321 of the first yoke unit 31 and the second yoke unit 32 may be closer to the first bias magnetic field generation unit 41 than the position of the first end surface 23 of the magnetoresistive effect element 2 (the free layer 203 or the ferromagnetic layer). The position in the Y direction of a first edge E41 of the first facing surface 411 of the first bias magnetic field generation unit 41 may be between the position in the Y direction of the first end surface 23 of the magnetoresistive effect element 2 (the free layer 203 or the ferromagnetic layer) and the position in the Y direction of the second edge E32 of the first end surfaces 311 and 321 of the first yoke unit 31 and the second yoke unit 32. In addition, the position in the Y direction of a first edge E31 of the second end surfaces 312 and 322 of the first yoke unit 31 and the second yoke unit 32 may be substantially the same as the position of the second end surface 24 of the magnetoresistive effect element 2 (the free layer 203 or the ferromagnetic layer) in the Y direction, and the position in the Y direction of a second edge E32 of each of the first end surfaces 312 and 322 of the first yoke unit 31 and the second yoke unit 32 may be closer to the second bias magnetic field generation unit 42 than the position of the second end surface 24 of the magnetoresistive effect element 2 (the free layer 203 or the ferromagnetic layer). The position in the Y direction of the first edge E41 of the second facing surface 412 of the second bias magnetic field generation unit 42 may be between the position in the Y direction of the second end surface 24 of the magnetoresistive effect element 2 (the free layer 203 or the ferromagnetic layer) and the position in the Y direction of the second edge E32 of the first end surfaces 311 and 321 of the first yoke unit 31 and the second yoke unit 32. Because the magnetoresistive effect element 2 (free layer 203 or ferromagnetic layer), the first yoke unit 31, the second yoke unit 32, the first bias magnetic field generation unit 41 and the second bias magnetic field generation unit 42 have the above-described positional relationship in the Y direction, and the first end surfaces 311 and 321 and the second end surfaces 321 and 322 of the first yoke unit 31 and the second yoke unit 32 along with the first facing surface 411 of the first bias magnetic field generation unit 41 and the second facing surface 412 of the second bias magnetic field generation unit 42 are inclined at the prescribed angle, the sensitivity of the magnetic sensor 1 improves and it is possible to control the occurrence of hysteresis of the output signal from the magnetic sensor 1.

In the plan view along the Z direction, the edge of the first end surface 23 of the magnetoresistive effect element 2 (the free layer 203 or the ferromagnetic layer) may overlap the first bias magnetic field generation unit 41. That is, the position in the Y direction of the first end surface 23 of the magnetoresistive effect element 2 (the free layer 203 or the ferromagnetic layer) may be positioned further in the direction toward the first bias magnetic field generation unit 41 (+Y direction) than the position of the first edge E41 of the first facing surface 411 of the first bias magnetic field generation unit 41. Similarly, the edge of the second end surface 24 of the magnetoresistive effect element 2 (the free layer 203 or the ferromagnetic layer) may overlap the second bias magnetic field generation unit 42. That is, the position in the Y direction of the second end surface 24 of the magnetoresistive effect element 2 (the free layer 203 or the ferromagnetic layer) may be positioned further in the direction toward the second bias magnetic field generation unit 42 (−Y direction) than the position of the first edge E41 of the second facing surface 412 of the second bias magnetic field generation unit 42.

A third aspect of the magnetic sensor 1 according to this embodiment will now be described.

Figure 9:
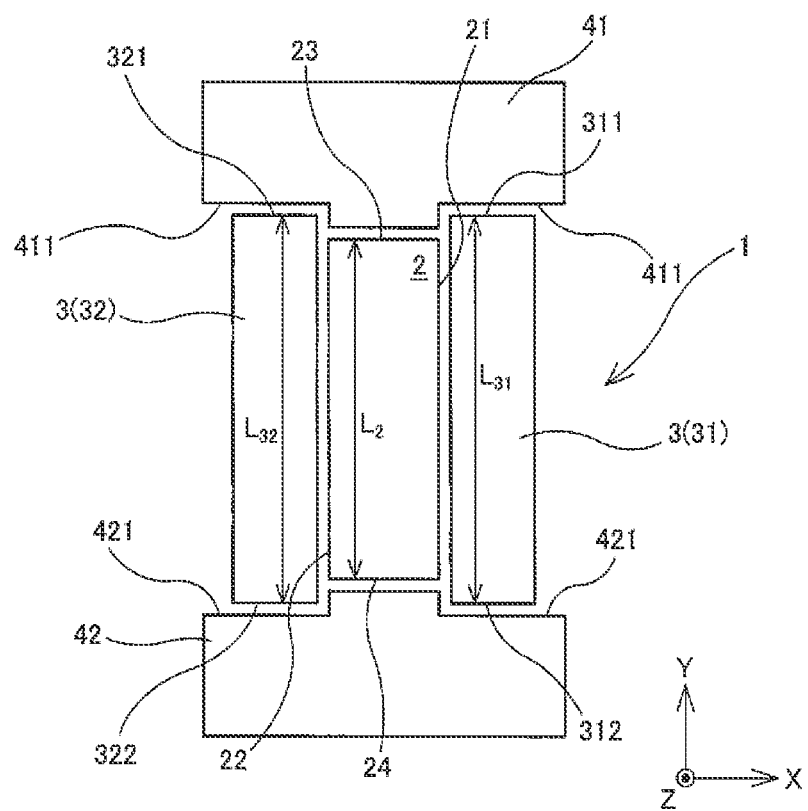
FIG. 9 is a plan view showing the schematic configuration of a third aspect of a magnetic sensor according to the embodiment of the present invention.
Figure 10A:
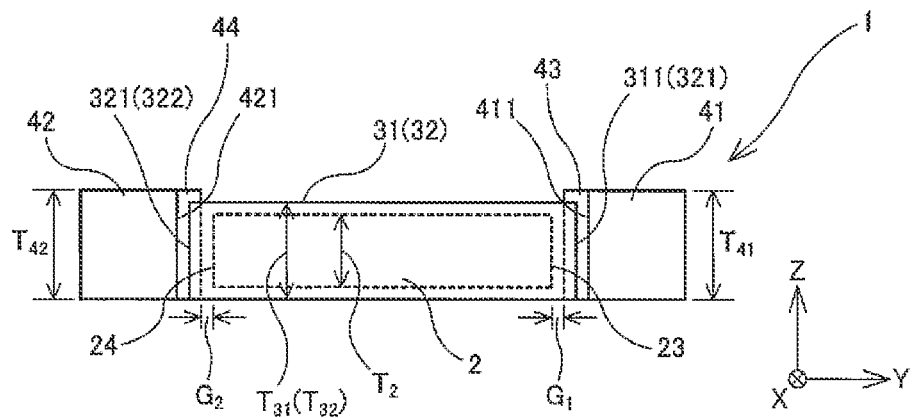
FIG. 10A is a cross-sectional view showing the schematic configuration of the third aspect of the magnetic sensor according to the embodiment of the present invention.
Figure 10B:
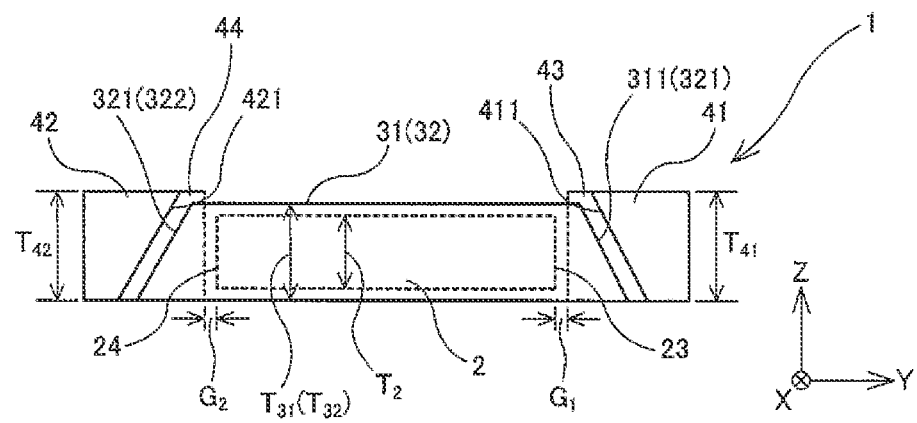
FIG. 10B is a cross-sectional view showing the schematic configuration of a variation of the third aspect of the magnetic sensor according to the embodiment of the present invention.
Figure 11A:
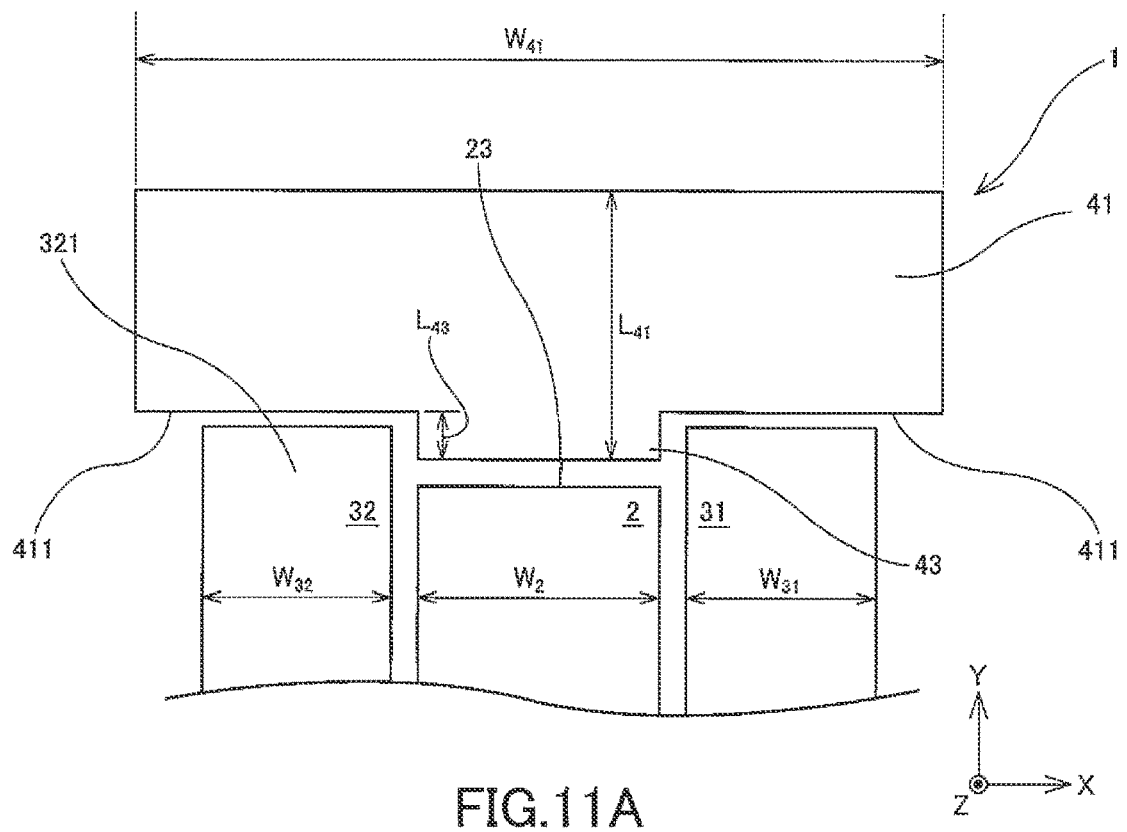
FIG. 11A is a partial enlarged plan view showing the schematic configuration of the third aspect of the magnetic sensor according to the embodiment of the present invention.
Figure 11B:
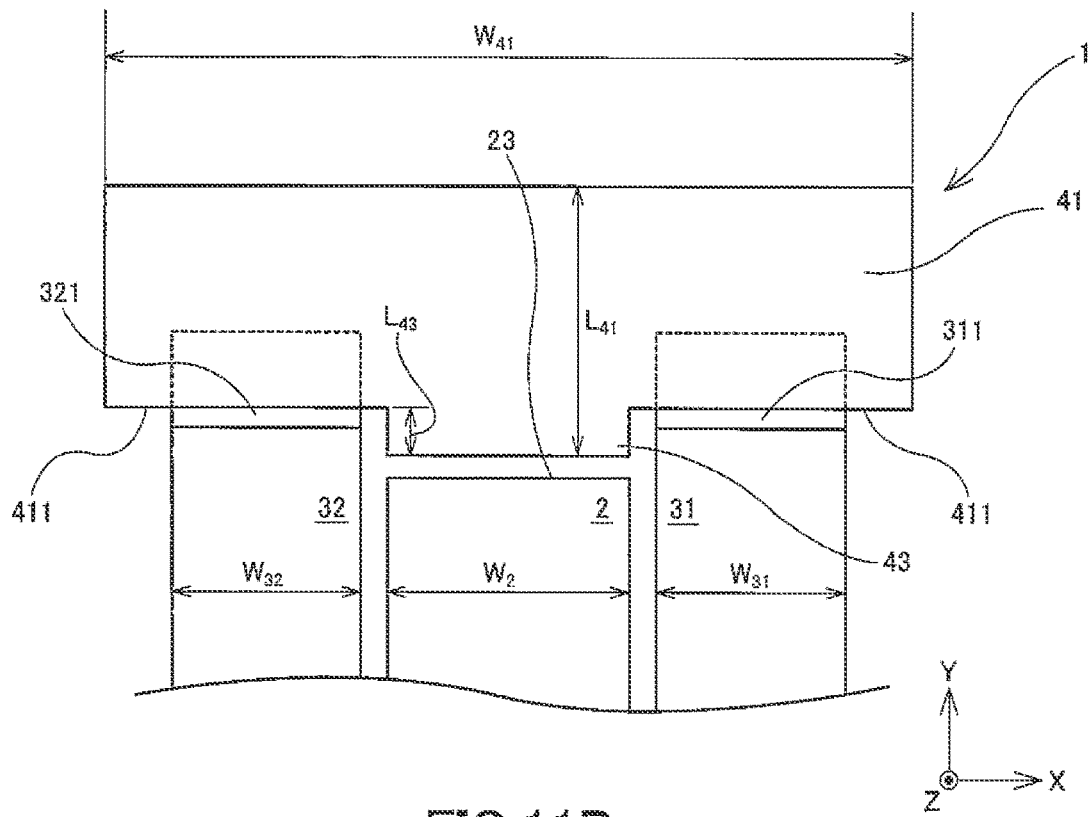
FIG. 11B is a partial enlarged plan view showing the schematic configuration of a variation of the third aspect of the magnetic sensor according to the embodiment of the present invention.
Figure 11C:
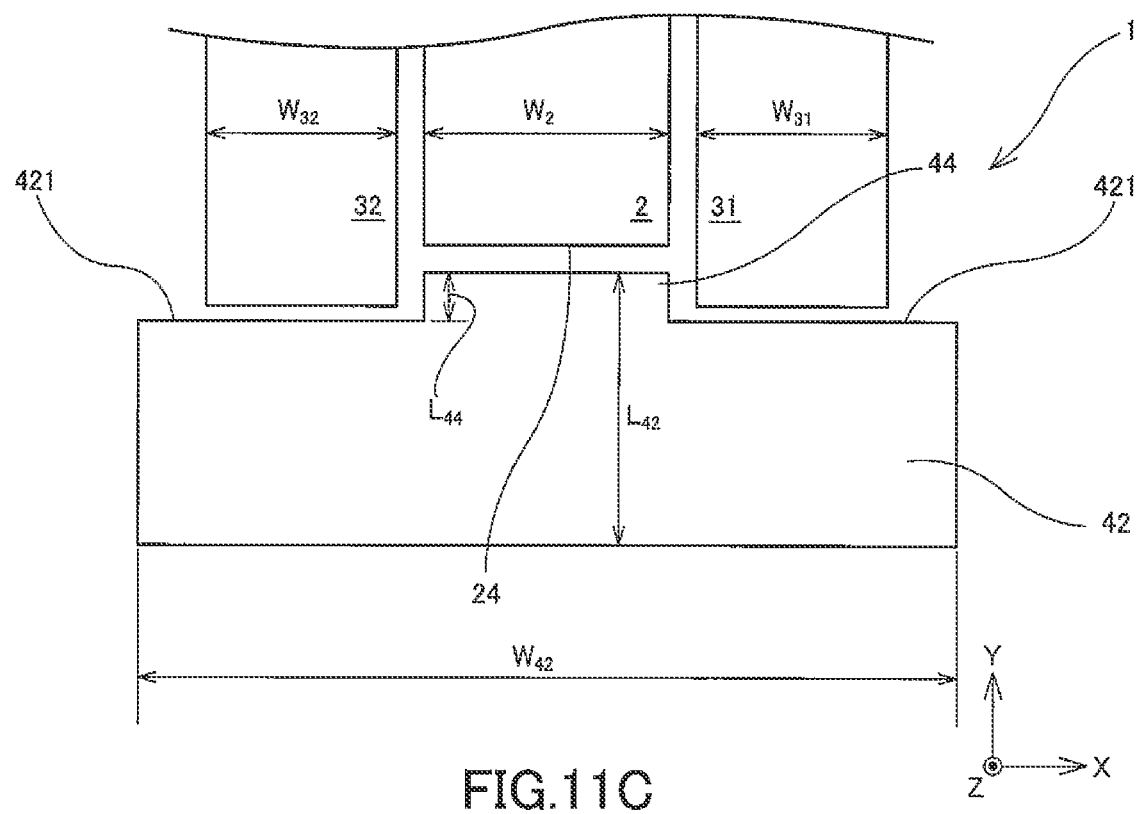
FIG. 11C is a partial enlarged plan view showing the schematic configuration of the third aspect of the magnetic sensor according to the embodiment of the present invention.
Figure 11D:
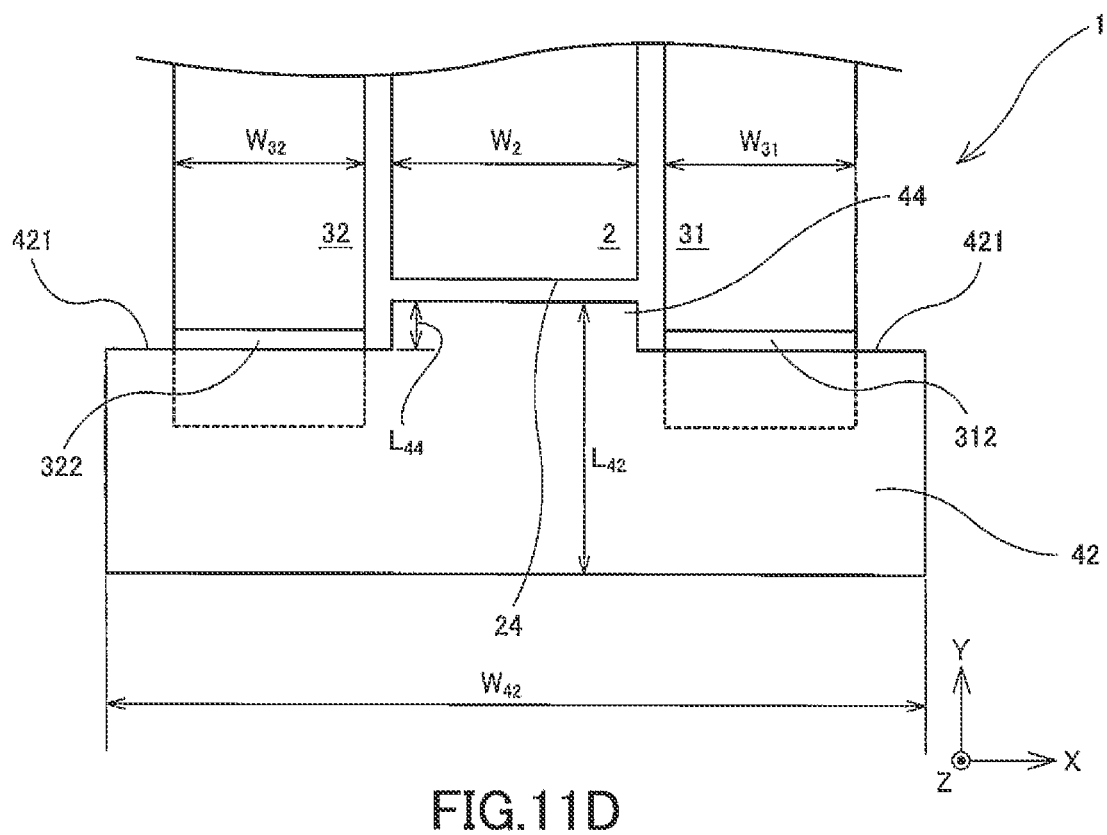
FIG. 11D is a partial enlarged plan view showing the schematic configuration of a variation of the third aspect of the magnetic sensor according to the embodiment of the present invention.
Figure 12A:
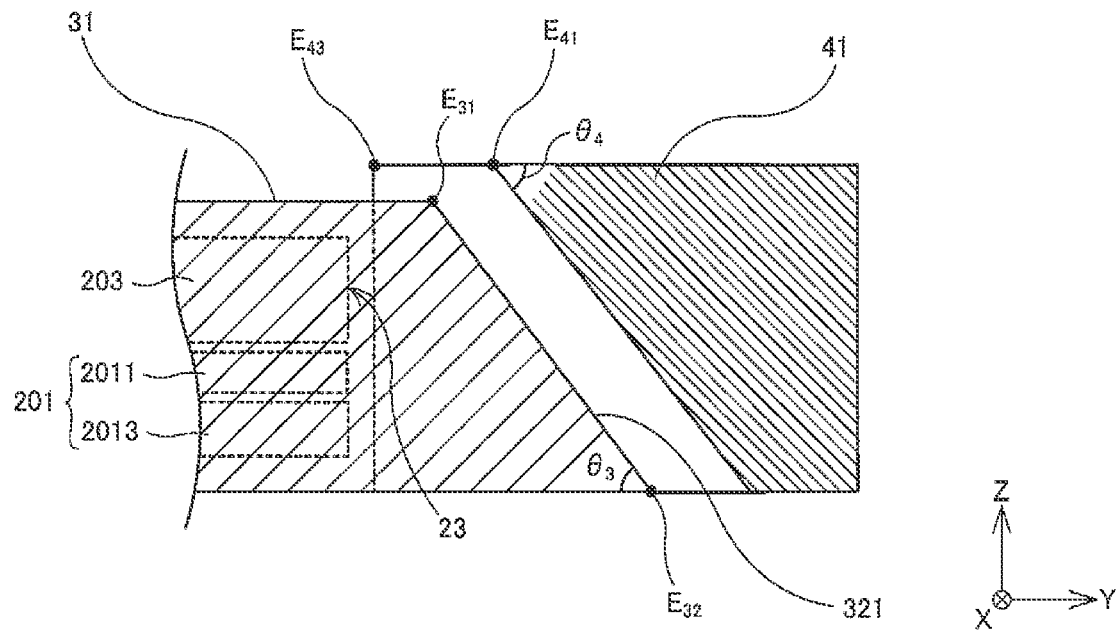
FIG. 12A is a partial enlarged cross-sectional view showing the schematic configuration of a variation of the third aspect of the magnetic sensor according to the embodiment of the present invention.
Figure 12B:
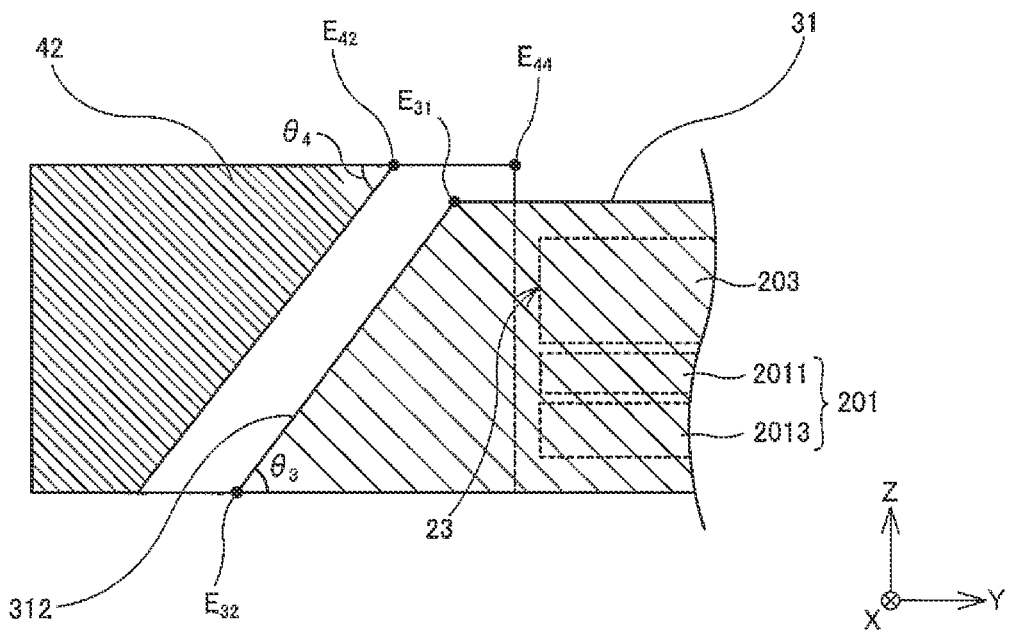
FIG. 12B is a partial enlarged cross-sectional view showing the schematic configuration of a variation of the third aspect of the magnetic sensor according to the embodiment of the present invention.

FIG. 9 is a plan view showing the schematic configuration of the third aspect of the magnetic sensor according to this embodiment, FIG. 10A and FIG. 10B are cross-sectional views showing the schematic configuration of the third aspect of the magnetic sensor according to this embodiment, FIGS. 11A~11D are partial enlarged plan views showing the schematic configuration of the third aspect of the magnetic sensor according to this embodiment, and FIG. 12A and FIG. 12B are a partial enlarged cross-sectional views showing the schematic configuration of the third aspect of the magnetic sensor according to this embodiment. Parts of the configuration that are like the first aspect and the second aspect of the magnetic sensor 1 are labeled with the same symbols and detailed description of such is omitted here.

As shown in FIG. 9 through FIG. 12B, in the third aspect of the magnetic sensor 1 according to this embodiment, the first bias magnetic field generation unit 41 has a first protruding part 43 that protrudes toward the first end surface 23 of the magnetoresistive effect element 2 along the Y direction from the first facing surface 411, and the second bias magnetic field generation unit 42 has a second protruding part 44 that protrudes toward the second end surface 24 of the magnetoresistive effect element 2 along the Y direction from the second facing surface 412. The first end surface 311 of the first yoke unit 31 faces the first facing surface 411 positioned to one side (one side in the X direction) of the first protruding part 43, and the first end surface 321 of the second yoke unit 32 faces the first facing surface 411 positioned to the other side (the other side in the X direction) of the first protruding part 43. The second end surface 312 of the first yoke unit 31 faces the second facing surface 412 positioned to one side (one side in the X direction) of the second protruding part 44, and the second end surface 322 of the second yoke unit 32 faces the second facing surface 412 positioned to the other side (the other side in the X direction) of the second protruding part 44. That is, the first end surface 23 of the magnetoresistive effect element 2 (free layer 203 or ferromagnetic layer), an edge E43 of the first protruding part 43, the first edge E31 of the first yoke unit 31 and the second yoke unit 32, the first edge E41 of the first facing surface 411 of the first bias magnetic field generation unit 41, and the second edge E32 of the first yoke unit 31 and the second yoke unit 32 may be positioned in that order along the Y direction (+Y direction) (see FIG. 12A). Similarly, the second end surface 24 of the magnetoresistive effect element 2 (free layer 203 or ferromagnetic layer), an edge E44 of the second protruding part 44, the first edge E31 of the first yoke unit 31 and the second yoke unit 32, the first edge E42 of the second bias magnetic field generation unit 42, and the second edge E32 of the first yoke unit 31 and the second yoke unit 32 may be positioned in that order along the Y direction (−Y direction) (see FIG. 12B). Because the first bias magnetic field generation unit 41 has the first protruding part 43, it is possible to make the position in the Y direction of the first end surfaces 311 and 321 of the first yoke unit 31 and the second yoke unit 32 be located further in the direction toward the first bias magnetic field generation unit 41 than the first end surface 23 of the magnetoresistive effect element 2 (free layer 203 or ferromagnetic layer). Similarly, because the second bias magnetic field generation unit 42 has the second protruding part 44, it is possible to make the position in the Y direction of the second end surfaces 312 and 322 of the first yoke unit 31 and the second yoke unit 32 be located further in the direction toward the second bias magnetic field generation unit 42 than the second end surface 24 of the magnetoresistive effect element 2 (free layer 203 or ferromagnetic layer). As a result, it is possible to improve the sensitivity of the magnetic sensor 1 and to control the occurrence of hysteresis of the output signal from the magnetic sensor 1.

The protrusion lengths L43 and L44 in the Y direction of the first protruding part 43 and the second protruding part 44 are not particularly limited, and for example may be on the order of 0.05~0.3 μm, preferably on the order of 0.1~0.2 μm. When these protrusion lengths L43 and L44 are less than 0.05 μm or exceed 0.3 μm, there is a concern that the effect of improving the sensitivity of the magnetic sensor 1 and the effect of controlling the occurrence of hysteresis of the output signal from the magnetic sensor 1 could diminish.

As shown in FIG. 12A and FIG. 12B, the first facing surface 411 of the first bias magnetic field generation unit 41 may be inclined at the prescribed angle $\theta_4$ with respect to the XY plane containing the X direction and the Y direction, and the second facing surface 412 of the second bias magnetic field generation unit 42 may be inclined at the prescribed angle with respect to the XY plane containing the X direction and the Y direction. In addition, the first end surfaces 311 and 321 of the first yoke unit 31 and the second yoke unit 32 may be inclined at the prescribed angle $\theta_3$ with respect to the XY plane containing the X direction and the Y direction, and the second end surfaces 312 and 322 of the first yoke unit 31 and the second yoke unit 32 may be inclined at the prescribed angle with respect to the XY plane containing the X direction and the Y direction.

In the third aspect shown in FIG. 9 through FIG. 12B, the entire surface along the Z direction of the first protruding part 43 and the second protruding part 44 protrudes toward the first end surface 23 of the magnetoresistive effect element 2, but this is intended to be illustrative and not limiting. For example, when the magnetoresistive effect element 2 is a GMR element or a TME element, the first protruding part 43 and the second protruding part 44 may be such that only a portion of the first bias magnetic field generation unit 41 and the second bias magnetic field generation unit 42 facing the free layer 203 in the Y direction at least protrudes. In addition, when the magnetoresistive effect element 2 is an AMR element, the first protruding part 43 and the second protruding part 44 may be such that only a portion of the first bias magnetic field generation unit 41 and the second bias magnetic field generation unit 42 facing the ferromagnetic layer in the Y direction at least protrudes.

Figure 14:
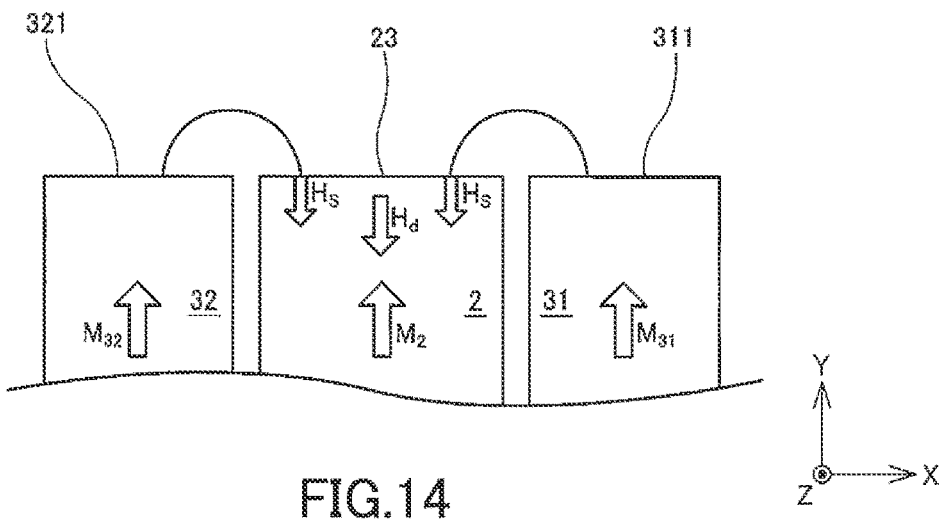
FIG. 14 is a plan view for describing the action effect of the first aspect of the magnetic sensor according to the embodiment of the present invention.
Figure 15:
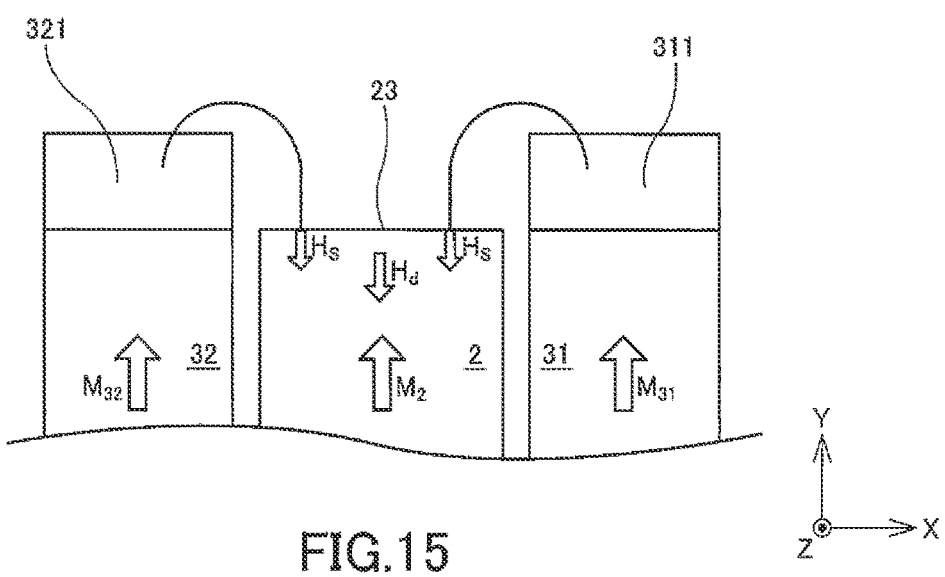
FIG. 15 is a plan view for describing the action effect of the second aspect of the magnetic sensor according to the embodiment of the present invention.
Figure 16:
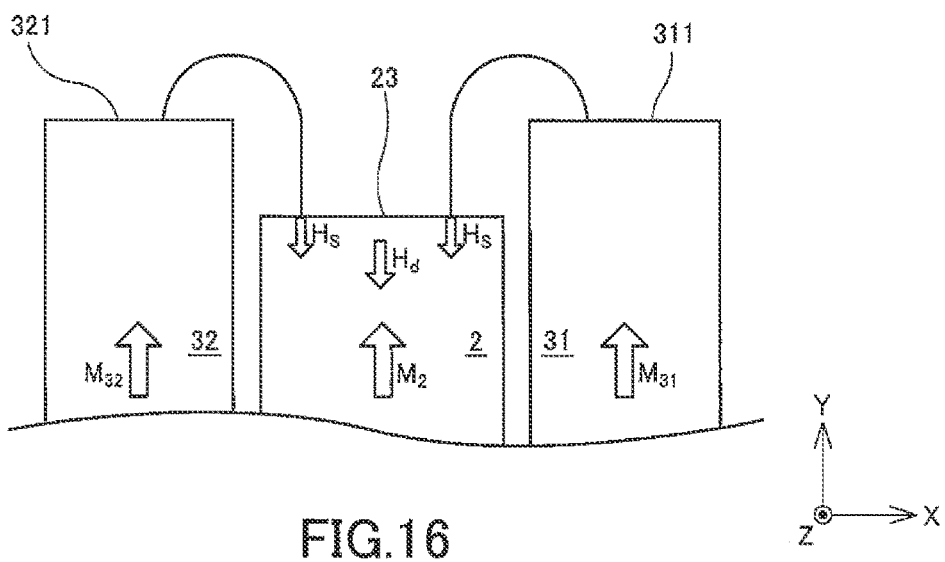
FIG. 16 is a plan view for describing the action effect of the third aspect of the magnetic sensor according to the embodiment of the present invention.

The operation effect of the first aspect through third aspect of the magnetic sensor according to this embodiment will now be described. FIGS. 14~16 are plan views for describing the operation effect of the first aspect through third aspect of the magnetic sensor 1 according to this embodiment.

As shown in FIGS. 14–16, in the magnetic sensor 1 according to this embodiment, a bias magnetic field in the Y direction is applied on the first yoke unit 31 and the second yoke unit 32 from the first bias magnetic field generation unit 41 and the second bias magnetic field generation unit 42. Through this, it is possible to stabilize the magnetization $M_2$ of the free layer 203 or ferromagnetic layer of the magnetoresistive effect element 2 along with the magnetization $M_{31}$ and $M_{32}$ of the first yoke unit 31 and the second yoke unit 32.

The first magnetic sensor 1 according to this embodiment is such that the first yoke unit 31 and the second yoke unit 32 capable of effectively focusing external magnetic fields are provided adjacent to the first side surface 21 and the second side surface 22 of the magnetoresistive effect element 2 with the objective of improving sensitivity to external magnetic fields. The length (thickness) in the Z direction of the first yoke unit 31 and second yoke unit 32 is greater (thicker) than the length (thickness) in the Z direction of the free layer 203 or ferromagnetic layer of the magnetoresistive effect element 2 to effectively focus external magnetic fields. Through this, it is possible for external magnetic fields to be effectively focused by the first yoke unit 31 and the second yoke unit 32 and to improve the sensitivity of the magnetic sensor 1.

On the other hand, because the length (thickness) in the Z direction of the first yoke unit 31 and the second yoke unit 32 is relatively long (thick), the static magnetic field $H_S$ from the first yoke unit 31 and the second yoke unit 32 causes the reduced magnetic field $H_d$ with respect to the free layer 203 or ferromagnetic layer of the magnetoresistive effect element 2 to increase. In the first aspect shown in FIG. 1 through FIG. 4, the first end surface 23 of the magnetoresistive effect element 2 (free layer 203 or ferromagnetic layer) and the first end surfaces 311 and 321 of the first yoke unit 31 and the second yoke unit 32 are positioned substantially on the same XZ plane, and through this t is easy to cause the reduced magnetic field $H_d$ to become even larger. By causing the reduced magnetic field $H_d$ to become larger in this manner, it becomes easy for the direction of the magnetization $M_2$ of the free layer 203 or ferromagnetic layer of the magnetoresistive effect element 2 to become unstable, creating the concern that hysteresis could easily occur in the output signal from the magnetic sensor 1. On this point, by having the first end surfaces 311 and 321 and the second end surfaces 312 and 322 of the first yoke unit 31 and the second yoke unit 32 be inclined at a prescribed angle with respect to the XY plan as in the second aspect, it is possible to cause the static magnetic field $H_S$ from the first yoke unit 31 and the second yoke unit 32 to diminish. Consequently, it is possible to cause the reduced magnetic field $H_d$ on the free layer 203 or ferromagnetic layer of the magnetoresistive effect element 2 to be relatively diminished, so it is possible to control the occurrence of hysteresis of the output signal from the magnetic sensor 1.

In the second aspect, the first end surfaces 311 and 321 and the second end surfaces 312 and 322 of the first yoke unit 31 and the second yoke unit 32 are inclined at a prescribed angle with respect to the XY plane, so the first facing surface 411 of the first bias magnetic field generation unit 41 and the second facing surface 412 of the second bias magnetic field generation unit 42 are also inclined at the prescribed angle. When the first facing surface 411 of the first bias magnetic field generation unit 41 and the second facing surface 412 of the second bias magnetic field generation unit 42 are inclined in this manner, the bias magnetic field from the first bias magnetic field generation unit 41 and the second magnetic field generation unit 42 diminishes.

On this point, by providing the first protruding part 43 on the first facing surface 411 and the second protruding part 44 on the second facing surface 412 as in the third aspect, it is possible for the first end surfaces 311 and 321 and the second end surfaces 312 and 322 of the first yoke unit 31 and the second yoke unit 32 to be positioned more to the first bias magnetic field generation unit 41 side and the second bias magnetic field generation unit 42 side than the first end surface 23 and the second end surface 24 of the magnetoresistive effect element 2 (free layer 203). Through this, it is possible to cause the static magnetic field $H_S$ from the first yoke unit 31 and the second yoke unit 32 to diminish, to cause the reduced magnetic field $H_d$ on the free layer 203 or ferromagnetic layer of the magnetoresistive effect element 2 to relatively diminish, and to cause the bias magnetic field from the first bias magnetic field generation unit 41 and the second bias magnetic field generation unit 42 to be effectively applied on the magnetoresistive effect element 2 (free layer 203 or ferromagnetic layer). As a result, it is possible to cause the sensitivity of the magnetic sensor 1 to external magnetic fields to improve and to control the occurrence of hysteresis of the output signal from the magnetic sensor 1.

Figure 17:
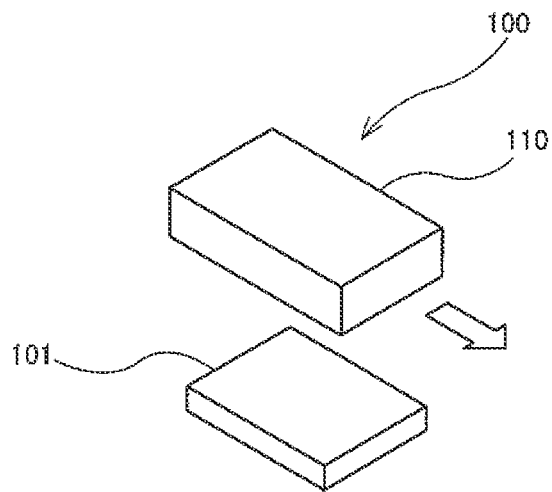
FIG. 17 is a perspective view showing the schematic configuration of a position detection device according to the embodiment of the present invention.

Next, a position detection device that uses the magnetic sensor 1 according to this embodiment will be described. FIG. 17 is a perspective view showing the schematic configuration of a position detection device according to this embodiment, FIG. 18 is a block diagram showing the schematic configuration of the position detection device according to this embodiment, and FIG. 19 is a circuit diagram schematically showing the circuit configuration of a magnetic sensor unit according to this embodiment.

As shown in FIG. 17, a position detection device 100 according to this embodiment comprises a magnetic sensor device 101 and a moving body 110 capable of linear movement relative to the magnetic sensor device 101 and is called a linear encoder.

Figure 18:
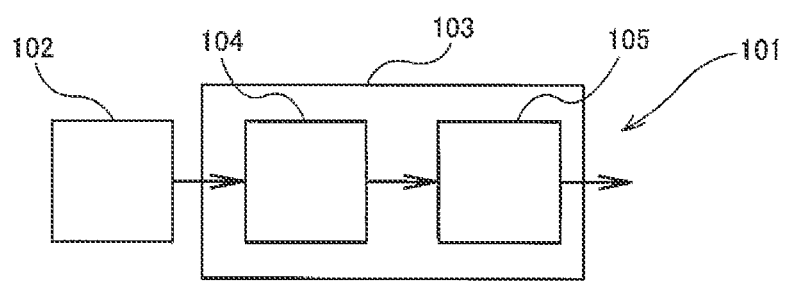
FIG. 18 is a block diagram showing the schematic configuration of the position detection device according to the embodiment of the present invention.
Figure 19:
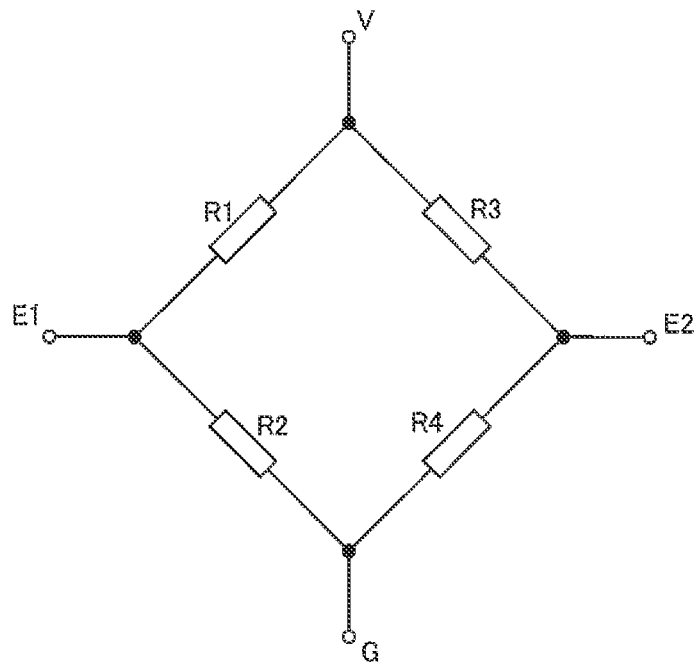
FIG. 19 is a circuit diagram schematically showing the circuit configuration of a magnetic sensor unit in the embodiment of the present invention.

As shown in FIG. 18, the magnetic sensor device 101 includes a magnetic sensor unit 102 that outputs a sensor signal based on changes in the external magnetic field accompanying linear movement of the moving body 110, and a calculation unit 103 that calculates the amount of movement of the moving body 110 based on the sensor signal output from the magnetic sensor unit 102.

The calculation unit 103 includes an A/D (analog-digital) conversion unit 104 that converts the analog signal (sensor signal) output from the magnetic sensor unit 102 into a digital signal, and an arithmetic processing unit 105 that processes the digital signal converted to digital by the A/D conversion unit 104 and calculates the amount of movement of the moving body 110. When the arithmetic processing results (movement amount) obtained in the arithmetic processing unit 105 are output as an analog signal, the calculation unit 103 may further include a D/A (digital-analog) conversion unit (omitted from the drawings) on the downstream side of the arithmetic processing unit 105.

The magnetic sensor unit 102 includes at least one magnetic detection element and may include a pair of magnetic detection elements connected in series. In this case, the magnetic sensor unit 102 has a Wheatstone bridge circuit that includes a pair of magnetic detection elements connected in series.

As shown in FIG. 19, the Wheatstone bridge circuit includes a power source port V, a ground port G, a first output port E1, a second output port E2, a first magnetic detection element R1 provided between the power source port V and the first output port E1, a second magnetic detection element R2 provided between the first output port E1 and the ground port G, a third magnetic detection element R3 provided between the power source port V and the second output port E2, and a fourth magnetic detection element R4 provided between the second output port E2 and the ground port G. A power source voltage (constant current) of a prescribed size is applied on the power source port V by connecting a constant current source, and the ground port G is connected to ground. The constant current applied on the power source port V is controlled to a prescribed current value by a driver IC not shown in the drawings.

In this embodiment, the magnetic sensor 1 (see FIGS. 1~12B) according to this embodiment is used as all the first through fourth magnetic detection elements R1 R4 included in the Wheatstone bridge circuit. The magnetization of the magnetization fixed layer 201 in all the magnetoresistive effect elements 2 included in the magnet sensor 1 are fixed in the same direction (+X direction) as each other. The magnetization of the magnetization fixed layer 201 in all the magnetoresistive effect elements 2 included in the magnetic sensor 1 may be fixed in roughly the same direction as each other, and in this case, the magnetization direction of the magnetization fixed layer 201 in each of the magnetoresistive effect elements 2 may be inclined at an angle within 10° of the +X direction. All the magnetoresistive effect elements 2 have a roughly rectangular shape in the Y direction, so the free layer 203 in each of the magnetoresistive effect elements 2 has shape anisotropy in which the easy magnetization axis is the Y direction. Furthermore, a bias magnetic field from the first bias magnetic field generation unit 41 and the second bias magnetic field generation unit 42 is applied on each of the magnetoresistive effect elements 2. Consequently, the magnetization directions of the free layers 203 in all the magnetoresistive effect elements 2 in the initial state (the state in which no external magnetic field is applied) are the same as each other and are a direction (+Y direction) orthogonal to the magnetization direction of the magnetization fixed layer 201. By having the magnetization direction of the magnetization fixed layer 201 and the free layer 203 be in the above-described directions, change occurs in the resistance values of the first through fourth magnetic detection elements R1~R4 in accordance with the external magnetic field in the X direction, and accompanying this the electric potential difference between the first output port E1 and the second output port E2 changes and a signal representing the change in this electric potential difference is output from a difference detector (omitted in the drawings).

The signal corresponding to the electric potential difference between the first output port E1 and the second output port E2 is output to the A/D conversion unit 104 from the difference detector. The A/D conversion unit 104 converts the sensor signal (analog signal relating to the amount of movement of the moving body 110) output from the magnetic sensor unit 102 into a digital signal, and this digital signal is input into the arithmetic processing unit 105.

The arithmetic processing unit 105 accomplishes arithmetic processing on the digital signal converted from the analog signal by the A/D conversion unit 104 and calculates the amount of movement of the moving body 110. The arithmetic processing unit 105 may be comprised for example of a microcomputer, an Application Specific Integrated Circuit (ASIC), or the like.

In the position detection device 100 according to this embodiment having the above-described configuration, the external magnetic field changes accompanying linear movement of the moving body 110, the resistance values of the first through fourth magnetic detection elements R1~R4 of the magnetic sensor unit 102 change in accordance with change in this external magnetic field, and a sensor signal is output from the difference detector in accordance with the electric potential difference between the first output port E1 and the second output port E2 of the magnetic sensor unit 102. Furthermore, the sensor signal output from the difference detector is converted into a digital signal by the A/D conversion unit 104. Following this, the amount of movement of the moving body 110 is calculated by the arithmetic processing unit 105.

In the position detection device 100 according to this embodiment, the magnetic sensor 1 possessed by the magnetic sensor unit 102 is such that the first bias magnetic field generation unit 41 and the second bias magnetic field generation unit 42 are respectively provided adjacent to the first end surface 23 and the second end surface 24 of the magnetoresistive effect element 2, and the first yoke unit 31 and the second yoke unit 32 are respectively provided adjacent to the first side surface 21 and the second side surface 22 of the magnetoresistive effect element 2, and consequently, there is high sensitivity to change in the external magnetic field, and moreover it is possible to control the occurrence of hysteresis of the signal output from the magnetic sensor unit 102. Hence, with the position detection device 100 according to this embodiment, it is possible to detect with high accuracy the amount of movement of the moving body 110.

Figure 20:
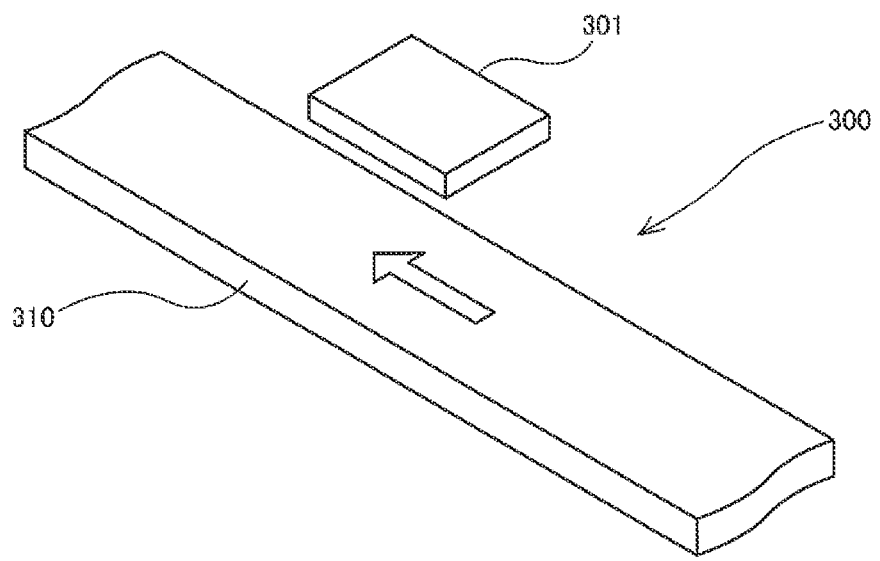
FIG. 20 is a perspective view showing the schematic configuration of a current sensor according to the embodiment of the present invention.
Figure 21:
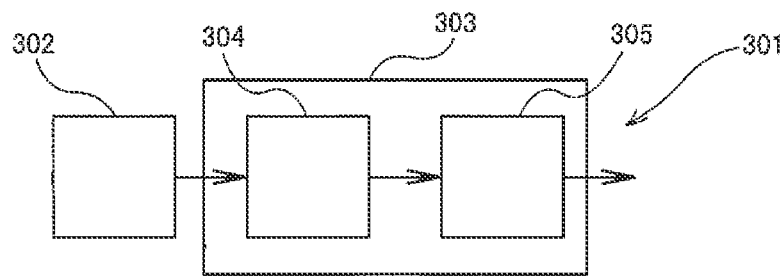
FIG. 21 is a block diagram showing the schematic configuration of the current sensor according to the embodiment of the present invention.

Next, a current sensor that uses the magnetic sensor 1 according to this embodiment will be described. FIG. 20 is a perspective view showing the schematic configuration of a current sensor according to this embodiment, and FIG. 21 is a block diagram showing the schematic configuration of the current sensor according to this embodiment of the present invention.

A current sensor 300 according to this embodiment controls the input/output current or the like of a battery in a hybrid electric vehicle or the like, for example, and measures, as the current being measured, the input/output current flowing in a bus bar 310 connected to the battery, for example, and comprises the bus bar 310 and a magnetic sensor device 301 that includes the magnetic sensor unit 302 provided near the bus bar 310 and a calculation unit 303 that calculates the input/output current flowing in the bus bar 310 on the basis of a sensor signal output from the magnetic sensor unit 302.

The calculation unit 303 includes an A/D (analog-digital) conversion unit 304 that converts the analog signal (sensor signal) output from the magnetic sensor unit 302 into a digital signal, and an arithmetic processing unit 305 that processes the digital signal converted to digital by the A/D conversion unit 304 and calculates the input/output current flowing in the bus bar 310. When the arithmetic processing results (input/output current) obtained in the arithmetic processing unit 305 are output as an analog signal, the calculation unit 303 may further include a DIA (digital-analog) conversion unit (omitted from the drawings) on the downstream side of the arithmetic processing unit 305.

The magnetic sensor unit 302 includes at least one magnetic detection element and may contain a pair of magnetic detection elements connected in series. In this case, the magnetic sensor unit 302 has a Wheatstone bridge circuit that includes a pair of magnetic detection elements connected in series (see FIG. 19).

A signal corresponding to the electric potential difference between the first output port E1 and the second output port E2 of the Wheatstone bridge circuit possessed by the magnetic sensor unit 302 is output to the A/D conversion unit 304 from a difference detector (omitted from the drawings). The A/D conversion unit 304 converts the sensor signal (analog signal relating to the input/output current flowing in the bus bar 310) output from the magnetic sensor unit 302 into a digital signal, and this digital signal is input into the arithmetic processing unit 305.

The arithmetic processing unit 305 accomplishes arithmetic processing on the digital signal converted from the analog signal by the A/D conversion unit 304 and calculates the input/output current flowing in the bus bar 310. The arithmetic processing unit 305 may be comprised for example of a microcomputer, an Application Specific Integrated Circuit (ASIC), or the like.

In the current sensor 300 according to this embodiment having the above-described configuration, a magnetic field is generated from the bus bar 310 accompanying flowing of the input/output current in the bus bar 310. The resistance values of the first through fourth magnetic detection elements R1~R4 of the magnetic sensor unit 302 change in accordance with the strength of the magnetic field generated from the bus bar 310. Furthermore, a sensor signal is output from the difference detector n accordance with the electric potential difference between the first output port E1 and the second output port E2 of the magnetic sensor unit 302. Furthermore, the sensor signal output from the difference detector is converted into a digital signal by the A/D conversion unit 304. Following this, the input/output current flowing in the bus bar 310 is calculated by the arithmetic processing unit 305.

The current sensor 300 according to this embodiment (see FIG. 20) can be provided in a magnetic control device. As the magnetic control device according to this embodiment, the battery management system, inverters, converters, and the like of a hybrid electric vehicle (HEV), or electric vehicle (EV) or the like can be cited. The current sensor 300 according to this embodiment is used to measure the input/output current from the power source and to output to the electric control device information relating to the measured current.

In the current sensor 300 according to this embodiment, the magnetic sensor 1 possessed by the magnetic sensor unit 302 is such that the first bias magnetic field generation unit 41 and the second bias magnetic field generation unit 42 are respectively provided adjacent to the first end surface 23 and the second end surface 24 of the magnetoresistive effect element 2, and the first yoke unit 31 and the second yoke unit 32 are respectively provided adjacent to the first side surface 21 and the second side surface 22 of the magnetoresistive effect element 2, and consequently, there is high sensitivity to the magnetic field generated from the bus bar 310, and moreover it is possible to control the occurrence of hysteresis of the signal output from the magnetic sensor unit 302. Hence, with the current sensor 300 according to this embodiment, it is possible to detect with high accuracy the input/output current flowing in the bus bar 310.

The above-described embodiment was described to facilitate understanding of the present invention and was not described to limit the present invention. Accordingly, each element disclosed in the above-described embodiment shall be construed to include all design modifications and equivalents falling within the technical scope of the present invention.

In the above-described embodiment, the magnetic sensor 1 was described by citing an aspect that includes one magnetoresistive effect element 2, the first bias magnetic field generation unit 41 and the second bias magnetic field generation unit 42 respectively provided adjacent to the first end surface 23 and the second end surface 24 thereof, and the first yoke unit 31 and the second yoke unit 32 respectively provided adjacent to the first side surface 21 and the second side surface 22 thereof, but this is intended to be illustrative and not limiting. For example, either of the first bias magnetic field generation unit 41 or the second bias magnetic field generation unit 42 need not be included, and either of the first yoke unit 31 or the second yoke unit 32 need not be included.

Figure 22:
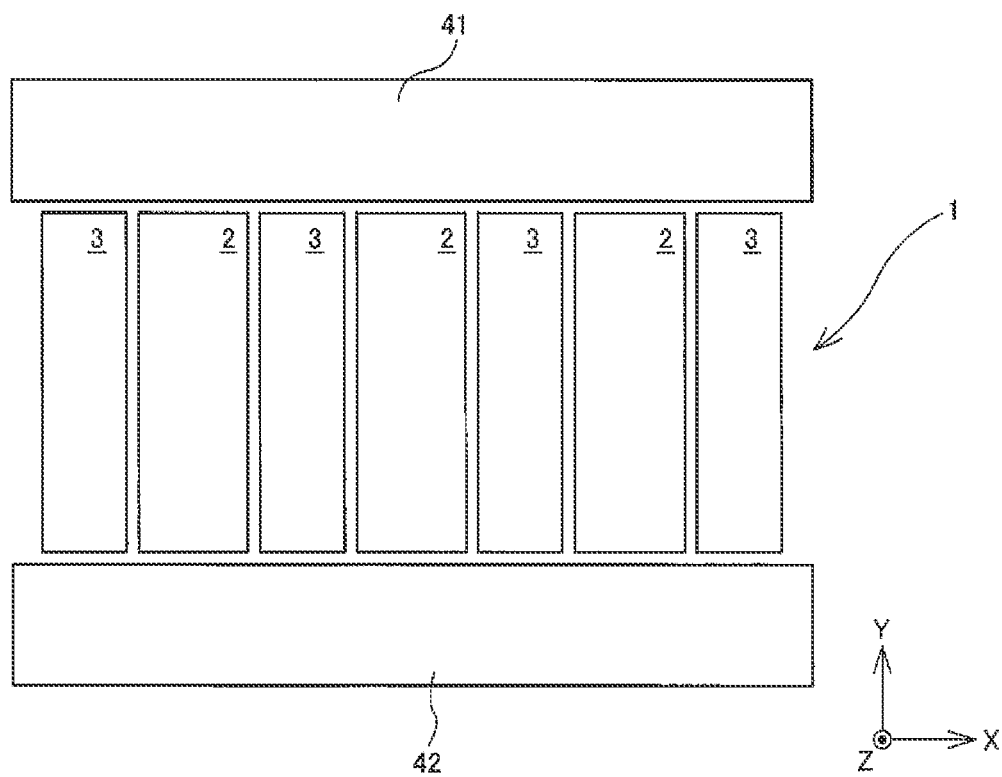
FIG. 22 is a plan view showing the schematic configuration of another aspect of the magnetic sensor according to the embodiment of the present invention.

The magnetic sensor 1 may have a plurality of magnetoresistive effect elements 2. In this case, the plurality of magnetoresistive effect elements 2 may be lined up so that yoke units 3 (first yoke unit 31 or second yoke units 32) are interposed alternatingly in the X direction (see FIG. 22). That is to say, the magnetoresistive effect elements 2 and the yoke units 3 (first yoke units 31, second yoke unit 32) are arranged alternating with each other along the X direction. In this aspect, the lengths W41 and W42 in the X direction of the first bias magnetic field generation unit 41 and the second bias magnetic field generation unit 42 may be large enough that all of the magnetoresistive effect elements 2 and all of the yoke units 3 (first yoke units 31, second yoke units 32) are contained within the region encompassed by the first bias magnetic field generation unit 41 and the second bias magnetic field generation unit 42 (the region within the scope of the lengths W41 and W42).

Embodiment

Below, the present invention will be described in greater detail by citing test examples, but the present invention is in no way limited by the below-described test examples.

TEST EXAMPLE 1

Figure 23:
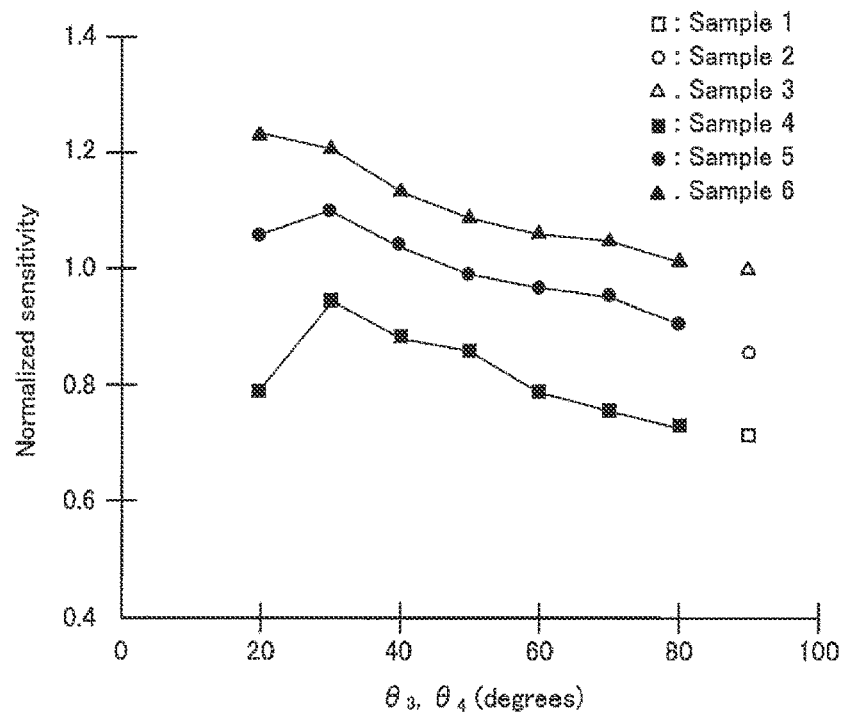
FIG. 23 is a graph showing simulation results for the sensitivity of the magnetic sensors according to Test Examples 1~6.
Figure 24:
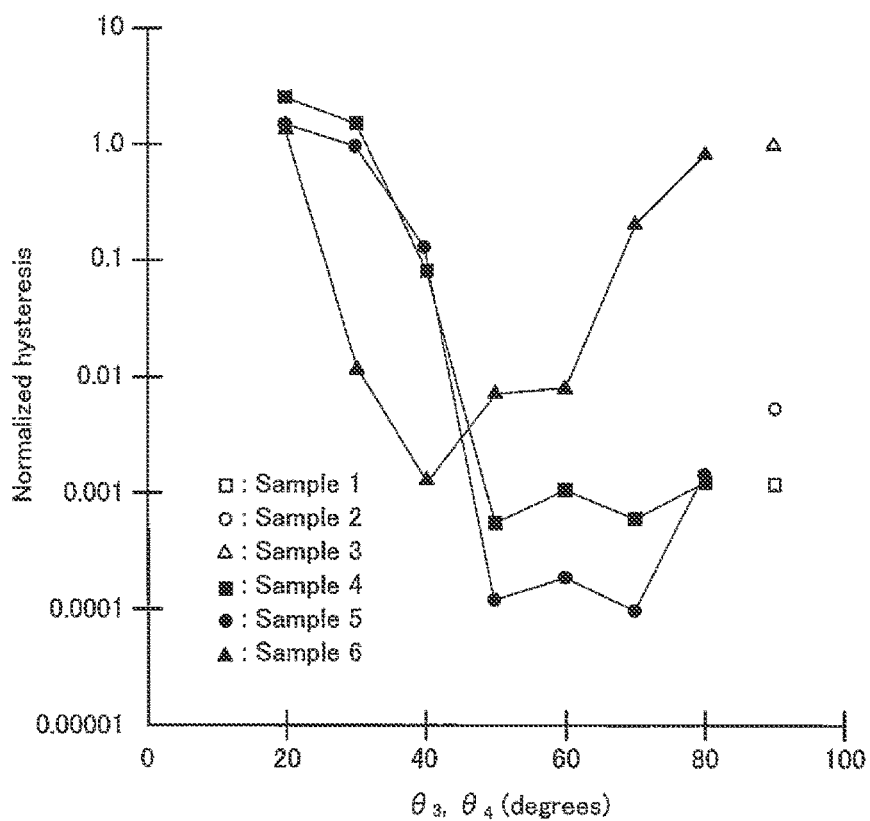
FIG. 24 is a graph showing simulation results for the hysteresis of the output signal of the magnetic sensors according to Test Examples 1~6.

In the magnetic sensor 1 having the configuration shown in FIGS. 1~4, the output signal from the magnetic sensor 1 was found through simulation in a case where the external magnetic field fluctuated within the range of −20 mT to 20 mT, and the sensitivity of the magnetic sensor 1 and the hysteresis of the output signal were calculated (Sample 1). Simulation results are shown in FIG. 23 and FIG. 24. In the above-described simulation, the lengths (W, μm) in the X direction, the lengths (L, μm) in the Y direction, the lengths (T, μm) in the Z direction, the volume magnetization (M, emu/cm$^3$), the exchange coupling energy (A, erg/cm) and the magnetic field strength (Hk, Oe) of each of the magnetoresistive effect element 2 (free layer 203 (FL), first ferromagnetic layer 2011 (RL), second ferromagnetic layer 2013 (PL)), the first yoke unit 31 (SY1), the second yoke unit 32 (SY2), the first bias magnetic field generation unit 41 (HM1) and the second bias field generation unit 41 (HM2) comprising the magnetic sensor 1 are as shown in Table 1.

TABLE 1

| | W (μm) | L (μm) | T (μm) | M (emu/cm$^3$) | A (erg/cm) | Hk (Oe) |
|---|---|---|---|---|---|---|
| FL | 0.8 | 2 | 10 | 800 | $1 \times 10^{-6}$ | 0 |
| RL | 0.8 | 2 | 1.8 | 1400 | $1 \times 10^{-6}$ | 0 |
| PL | 0.8 | 2 | 1.8 | 1400 | $1 \times 10^{-6}$ | 0 |
| SY1 | 0.5 | 2 | 10 | 800 | $1 \times 10^{-6}$ | 0 |
| SY2 | 0.5 | 2 | 10 | 800 | $1 \times 10^{-6}$ | 0 |
| HM1 | 4 | 1.75 | 40 | 400 | $1 \times 10^{-8}$ | 15000 |
| HM2 | 4 | 1.75 | 40 | 400 | $1 \times 10^{-8}$ | 15000 |

TEST EXAMPLE 2

Other than the length (T) in the Z direction of the first yoke unit 31 (SY1) and the second yoke unit 32 (SY2) being 20 μm, the output signal from the magnetic sensor 1 was found through simulation the same as in Test Example 1, and the sensitivity of the magnetic sensor 1 and the hysteresis of the output signal were calculated (Sample 2). Results are shown in FIG. 23 and FIG. 24.

TEST EXAMPLE 3

Other than the length (T) in the Z direction of the first yoke unit 31 (SY1) and the second yoke unit 32 (SY2) being 30 μm, the output signal from the magnetic sensor 1 was found through simulation the same as in Test Example 1, and the sensitivity of the magnetic sensor 1 and the hysteresis of the output signal were calculated (Sample 3). Results are shown in FIG. 23 and FIG. 24.

TEST EXAMPLE 4

Other than the angle of inclination 83 of the first end surfaces 311 and 321 and the second end surfaces 312 and 322 of the first yoke unit 31 and the second yoke unit 32, and the angle of inclination 84 of the first facing surface 411 of the first bias magnetic field generation unit 41 and the second facing surface 412 of the second bias magnetic field generation unit 42 being 20°, 30°, 40°, 50°, 60°, 70° or 80°, the output signal from the magnetic sensor 1 was found through simulation the same as in Test Example 1 using the magnetic sensor 1 having the configuration shown in FIGS. 5~8B, and the sensitivity of the magnetic sensor 1 and the hysteresis of the output signal were calculated (Sample 4). Results are shown in FIG. 23 and FIG. 24.

TEST EXAMPLE 5

Other than the length (T) in the Z direction of the first yoke unit 31 (SY1) and the second yoke unit 32 (SY2) being 20 μm, the output signal from the magnetic sensor 1 was found through simulation the same as in Test Example 4, and the sensitivity of the magnetic sensor 1 and the hysteresis of the output signal were calculated (Sample 5). Results are shown in FIG. 23 and FIG. 24.

TEST EXAMPLE 6

Other than the length (T) in the Z direction of the first yoke unit 31 (SY1) and the second yoke unit 32 (SY2) being 30 μm, the output signal from the magnetic sensor 1 was found through simulation the same as in Test Example 4, and the sensitivity of the magnetic sensor 1 and the hysteresis of the output signal were calculated (Sample 6). Results are shown in FIG. 23 and FIG. 24.

TEST EXAMPLE 7

Figure 25:
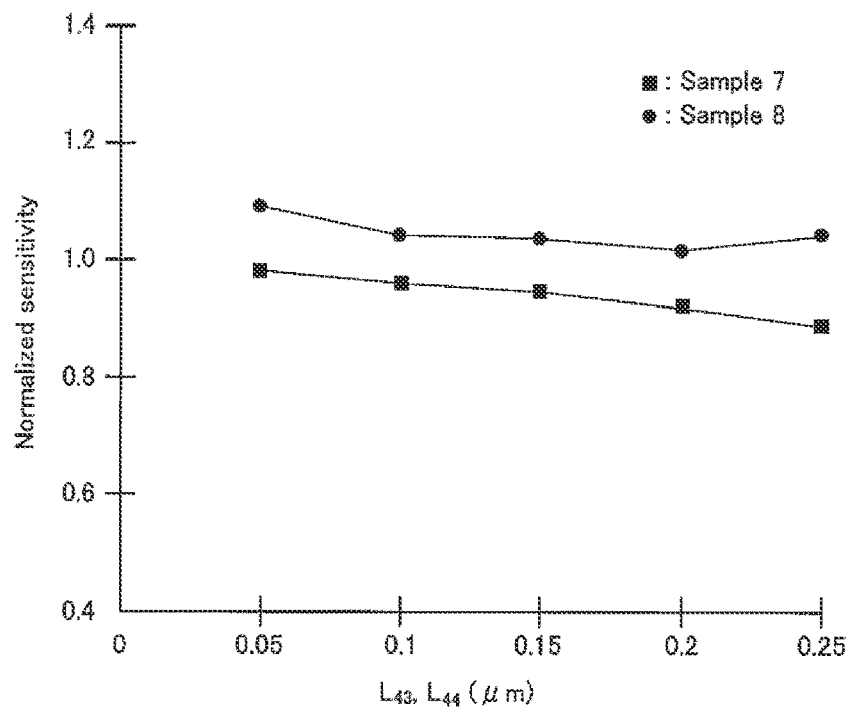
FIG. 25 is a graph showing simulation results for the sensitivity of the magnetic sensors according to Test Example 7 and Test Example 8.
Figure 26:
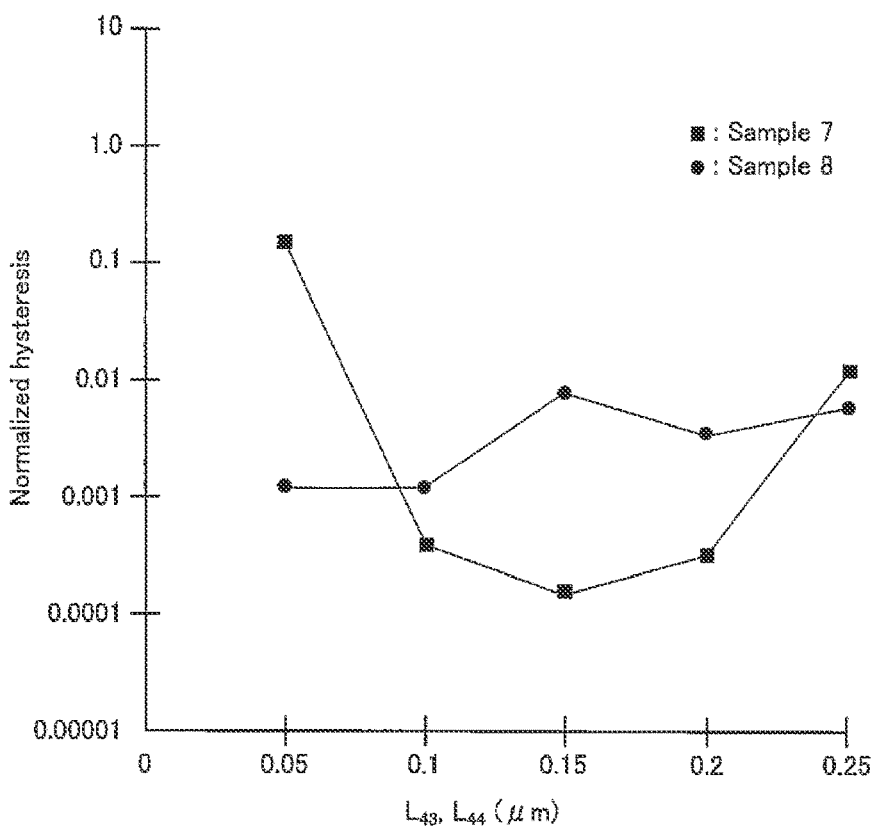
FIG. 26 is a graph showing simulation results for the hysteresis of the output signal of the magnetic sensors according to Test Example 7 and Test Example 8.

Other than the protrusion length L43 of the first protruding part 43 of the first bias magnetic field generation unit 41 and the protrusion length L44 of the second protruding part 44 of the second bias magnetic field generation unit 42 being 0.05 μm, 0.1 μm, 0.15 μm, 0.2 μm or 0.25 μm, the output signal from the magnetic sensor 1 was found through simulation the same as in Test Example 3 using the magnetic sensor 1 having the configuration shown in FIG. 9, FIG. 10A, FIG. 11A and FIG. 11C, and the sensitivity of the magnetic sensor 1 and the hysteresis of the output signal were calculated (Sample 7), Results are shown in FIG. 25 and FIG. 26.

TEST SAMPLE 8

Other than the angle of inclination 83 of the first end surfaces 311 and 321 and the second end surfaces 312 and 322 of the first yoke unit 31 and the second yoke unit 32, and the angle of inclination 94 of the first facing surface 411 of the first bias magnetic field generation unit 41 and the second facing surface 412 of the second bias magnetic field generation unit 42 being 50°, the output signal from the magnetic sensor 1 was found through simulation the same as in Test Example 7, and the sensitivity of the magnetic sensor 1 and the hysteresis of the output signal were calculated (Sample 8). Results are shown in FIG. 25 and FIG. 26.

In the graph shown in FIG. 23, the vertical axis represents the normalized sensitivity, and the horizontal axis represents the angle of inclination $\theta_3$ of the first end surface 311 and 321 and the second end surface 312 and 322 and the angle of inclination $\theta_4$ of the first facing surface 411 and the second facing surface 412. In the graph shown in FIG. 24, the vertical axis represents the normalized hysteresis, and the horizontal axis represents the angle of inclination $\theta_3$ of the first end surface 311 and 321 and the second end surface 312 and 322 and the angle of inclination $\theta_4$ of the first facing surface 411 and the second facing surface 412.

In the graph shown in FIG. 25, the vertical axis represents the normalized sensitivity, and the horizontal axis represents the protrusion length L43 of the first protruding part 43 of the first bias magnetic field generation unit 41 and the protrusion length L44 of the second protruding part 44 of the second bias magnetic field generation unit 42. In the graph shown in FIG. 26, the vertical axis represents the normalized hysteresis, and the horizontal axis represents the protrusion length L43 of the first protruding part 43 of the first bias magnetic field generation unit 41 and the protrusion length L44 of the second protruding part 44 of the second bias magnetic field generation unit 42.

As shown in FIG. 23 and FIG. 24, it was confirmed that the larger the length (T) in the Z direction of the first yoke unit 31 and the second yoke unit 32, the more it is possible to improve the sensitivity of the magnetic sensor 1 and to reduce hysteresis of the output signal. In addition, it was confirmed that compared to having the first end surfaces 311 and 321 and the second end surfaces 312 and 322 of the first yoke unit 31 and the second yoke unit 32 along with the first facing surface 411 of the first bias magnetic field generation unit 41 and the second facing surface 412 of the second bias magnetic field generation unit 42 orthogonal to the XY plane (Samples 1-3), having the first end surfaces 311 and 321 and the second end surfaces 312 and 322 along with the first facing surface 411 and the second facing surface 412 inclined with respect to the XY plane (Samples 4-6) improved the sensitivity of the magnetic sensor 1 and reduced hysteresis of the output signal. In particular, it was confirmed that by having the angle of inclination 83 of the first end surfaces 311 and 321 and the second end surfaces 312 and 322 along with the angle of inclination 84 first facing surface 411 and the second facing surface 412 be 40°~70°, it is possible to effectively improve the sensitivity of the magnetic sensor 1 and to effectively reduce hysteresis of the output signal.

As shown in FIG. 25 and FIG. 26, it was confirmed that by the first bias magnetic field generation unit 41 having the first protruding part 43 protruding toward the first end surface 23 of the magnetoresistive effect element 2 and the second bias magnetic field generation unit 42 having the second protruding part 44 protruding toward the second end surface 24 of the magnetoresistive effect element 2 (Samples 7 and 8), it is possible to improve the sensitivity of the magnetic sensor 1 and to reduce hysteresis of the output signal.

The invention claimed is:

1. A magnetic sensor comprising:
a magnetoresistive effect element including a first side surface and a second side surface, which face in opposite directions along a first axis, and a first end surface and a second end surface, which face in opposite directions along a second axis, wherein the first axis is substantially orthogonal to the second axis, and the magnetoresistive effect element has a sensitivity axis that extends in a direction of the first axis;
a first yoke unit provided adjacent to the first side surface of the magnetoresistive effect element;
a first bias magnetic field generation unit provided adjacent to the first end surface of the magnetoresistive effect element, and
a substrate having a first surface;
wherein a surface included the first side surface, a surface included the second side surface, a surface included the first end surface, and a surface included the second end surface are surfaces that intersect the first surface of the substrate;
the magnetoresistive effect element, the first yoke unit and the first bias magnetic field generation unit are provided on the first surface of the substrate; and
the first bias magnetic field generation unit is provided to be capable of applying a bias magnetic field on the magnetoresistive effect element and the first yoke unit.

2. The magnetic sensor according to claim 1, wherein:
the length of the first bias magnetic field generation unit in the direction of the first axis is greater than a sum of the lengths of the magnetoresistive effect element and the first yoke unit in the direction of the first axis; and
the magnetoresistive effect element and the first yoke unit are provided to fit in a range of the length of the first bias magnetic field generation unit in the first direction.

3. The magnetic sensor according to claim 1, further comprising a second yoke unit provided adjacent to the second side surface of the magnetoresistive effect element.

4. The magnetic sensor according to claim 3, wherein:
the length of the first bias magnetic field generation unit in the direction of the first axis is longer than a sum of the lengths of the magnetoresistive effect element, the first yoke unit and the second yoke unit in the direction of the first axis; and
the magnetoresistive effect element, the first yoke unit and the second yoke unit are provided to fit in a range of the length of the first bias magnetic field generation unit in the first direction.

5. The magnetic sensor according to claim 3, wherein the magnetoresistive effect element is one of a plurality of the magnetoresistive effect elements, and the magnetoresistive effect elements and either one of the first yoke unit or the second yoke unit are arranged alternatingly along the direction of the first axis.

6. The magnetic sensor according to claim 1, further comprising a second bias magnetic field generation unit provided adjacent to the second end surface of the magnetoresistive effect element.

7. The magnetic sensor according to claim 6, wherein the second bias magnetic field generation unit touches the second end surface of the magnetoresistive effect element.

8. The magnetic sensor according to claim 6, wherein the second bias magnetic field generation unit faces the second end surface of the magnetoresistive effect element with a prescribed gap in between.

9. The magnetic sensor according to claim 1, wherein the first bias magnetic field generation unit touches the first end surface of the magnetoresistive effect element.

10. The magnetic sensor according to claim 1, wherein the first bias magnetic field generation unit faces the first end surface of the magnetoresistive effect element with a prescribed gap in between.

11. The magnetic sensor according to claim 1, wherein the edge of the first bias magnetic field generation unit positioned on the magnetoresistive effect element side overlaps the end of the first yoke unit in the plan view of the magnetic sensor.

12. The magnetic sensor according to claim 11, wherein:
the first bias magnetic field generation unit has a first facing surface facing the first end surface of the magnetoresistive effect element;
the first facing surface is inclined at a prescribed angle with respect to the second direction; and
the first end surface of the first yoke unit facing the first facing surface is inclined at a prescribed angle with respect to the second direction.

13. The magnetic sensor according to claim 11, further comprising a second bias magnetic field generation unit provided adjacent to the second end surface of the magnetoresistive effect element;
wherein the edge of the second bias magnetic field generation unit positioned on the magnetoresistive effect element side overlaps the end of the first yoke unit in the plan view of the magnetic sensor.

14. The magnetic sensor according to claim 13, wherein:
the second bias magnetic field generation unit has a second facing surface facing the second end surface of the magnetoresistive effect element;
the second facing surface is inclined at a prescribed angle with respect to the second direction; and
the second end surface of the first yoke unit facing the second facing surface is inclined at a prescribed angle with respect to the second direction.

15. The magnetic sensor according to claim 1, wherein the first bias magnetic field generation unit has a facing surface that faces the first end surface of the magnetoresistive effect element and a protruding part that protrudes toward the first end surface of the magnetoresistive effect element from the facing surface.

16. The magnetic sensor according to claim 15, further comprising a second bias magnetic field generation unit provided adjacent to the second end surface of the magnetoresistive effect element, wherein the second bias magnetic field generation unit has a facing surface that faces the second end surface of the magnetoresistive effect element and a protruding part that protrudes toward the second end surface of the magnetoresistive effect element from the facing surface.

17. The magnetic sensor according to claim 1, wherein the magnetoresistive effect element includes a laminated body in which at least a magnetization fixed layer the magnetization of which is fixed, and a magnetization free layer the magnetization direction of which changes in accordance with an external magnetic field, are layered.

18. The magnetic sensor according to claim 1, wherein the magnetoresistive effect element is an AMR element, a GMR element or a TMR element.

19. A position detection device comprising:
- a magnetic detection unit that outputs a detection signal based on change in an external magnetic field accompanying movement of a moving body; and
- a calculation unit that calculates an amount of movement of the moving body based on the detection signal output from the magnetic detection unit,
- wherein the magnetic detection unit includes the magnetic sensor according to claim 1.

20. A current sensor comprising a magnetic detection unit that detects magnetism generated from a conductor in which a current to be measured flows, wherein the magnetic detection unit includes the magnetic sensor according to claim 1.

\* \* \* \* \*